United States Patent
Mhatre et al.

(10) Patent No.: US 11,697,585 B2
(45) Date of Patent: Jul. 11, 2023

(54) DEPLOYABLE KIRIFORM FLEXURES

(71) Applicant: President and Fellows of Harvard College, Cambridge, MA (US)

(72) Inventors: Saurabh Avinash Mhatre, Cambridge, MA (US); Martin Bechthold, Cambridge, MA (US); Allen Sayegh, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 671 days.

(21) Appl. No.: 16/630,922

(22) PCT Filed: Jul. 18, 2018

(86) PCT No.: PCT/US2018/042719
§ 371 (c)(1),
(2) Date: Jan. 14, 2020

(87) PCT Pub. No.: WO2019/018546
PCT Pub. Date: Jan. 24, 2019

(65) Prior Publication Data
US 2020/0231430 A1 Jul. 23, 2020

Related U.S. Application Data
(60) Provisional application No. 62/534,109, filed on Jul. 18, 2017.

(51) Int. Cl.
*B81B 3/00* (2006.01)
*B25J 15/00* (2006.01)
(Continued)

(52) U.S. Cl.
CPC .............. *B81B 3/0097* (2013.01); *B25J 15/00* (2013.01); *B29C 53/36* (2013.01); *B29C 53/80* (2013.01); *B81B 2203/053* (2013.01)

(58) Field of Classification Search
CPC .................................................. B81B 3/0097
See application file for complete search history.

(56) References Cited

U.S. PATENT DOCUMENTS

| 7,648,120 B1 | 1/2010 | Kota et al. | |
| 8,689,514 B1 * | 4/2014 | Sternowski | ............ H01Q 1/288 |
| | | | 52/646 |

(Continued)

FOREIGN PATENT DOCUMENTS

WO        2017200991 A2      11/2017

OTHER PUBLICATIONS

KirigamiArt, "09 Amazing Kirigami Paper Art Tutorial" [online] (retrieved from the internet on Aug. 20, 2018 & on Aug. 25, 2022) <URL https://www.youtube.com/watch?v=OrS78V7Oc6o>, Jul. 7, 2013.

(Continued)

*Primary Examiner* — Moazzam Hossain
(74) *Attorney, Agent, or Firm* — Modern Times Legal; Robert J. Sayre

(57) ABSTRACT

A deployable Kiriform flexure includes first and second sections. The first section of the Kiriform flexure includes a plurality of curved fins arranged about a central axis. The second section of the Kiriform flexure includes a plurality of curved fins arranged about a central axis. Each fin of the second section is joined with a fin of the first section such that the first and second sections share a common central axis in a configuration that produces out-of-plane elastic buckling of the fins to actuate the Kiriform flexure from a substantially flat structure that extends substantially only in two dimensions orthogonal to the central axis to an expanded structure extending substantially in a third dimension parallel to the central axis when at least one of the first and second sections is rotated relative to the other section.

20 Claims, 25 Drawing Sheets

(51) Int. Cl.
   *B29C 53/36* (2006.01)
   *B29C 53/80* (2006.01)

(56) References Cited

U.S. PATENT DOCUMENTS

| | | |
|---|---|---|
| 8,836,666 B2 | 9/2014 | Sreetharan |
| 2016/0184041 A1 | 6/2016 | Gafford et al. |

OTHER PUBLICATIONS

ArtsnCraft4u, "How to make paper lantern with 2 copy papers (quick and easy)" [online] (retrieved from the internet on Aug. 20, 2018) <URL https://www.youtube.com/watch?v=u9CLt9VVUQY>, Aug. 28, 2013.

USPTO, International Search Report and Written Opinion for PCT/US18/42719, dated Oct. 15, 2018.

* cited by examiner

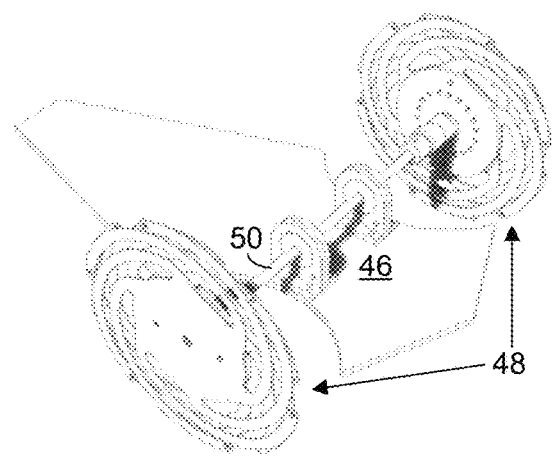
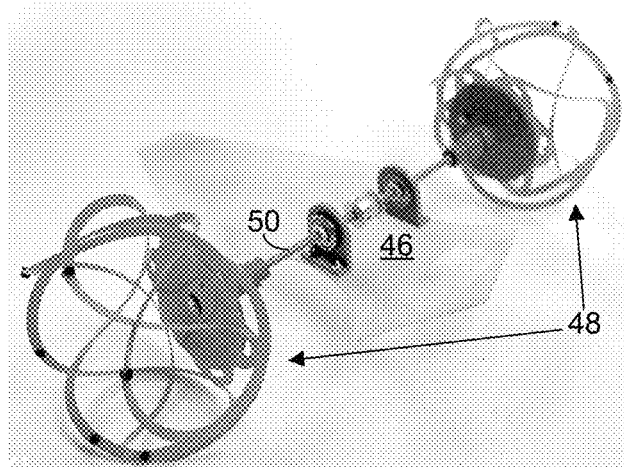
FIG. 50　　　　　　　　FIG. 51
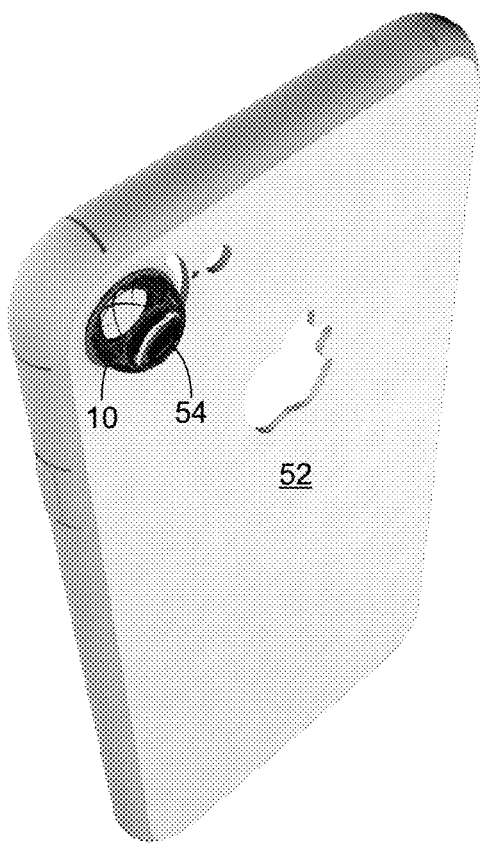
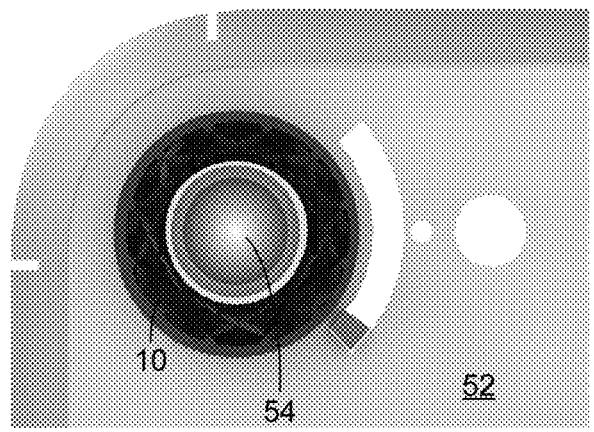
FIG. 53
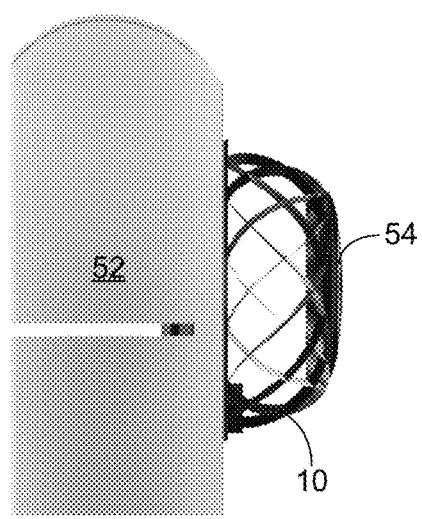
FIG. 52　　　　　　　　FIG. 54

DEPLOYABLE KIRIFORM FLEXURES

BACKGROUND

Kirigami is the technique of cutting sheets of material such that, when folded or bent and joined, they produce three-dimensional models. Kirigami is a variation of origami, wherein material (e.g., paper) is cut and folded rather than simply folding without cutting, as in traditional origami.

One example of kirigami is the fabrication of paper snowflakes, wherein a sheet of paper is folded over multiple times along different axes (e.g., in a six-fold geometry), and sections are cut from the edges of the folded paper. When the paper is then unfolded, the resulting structure can have an array of symmetrical apertures and resemble the crystalline pattern of a snowflake.

SUMMARY

Described herein is a series of complex deployable forms that use simple rotational motion through the technique of Kirigami with the approaches described herein involving the geometric transformation of structures from 2D to 3D (flat to volumetric) using flexure and based on patterns cut from flat sheets as well as the use of minimal joinery. The flexure can move between a static, flat condition and two deployed conditions that are determined by the direction of rotation. The materials used can be flat sheet materials cut into specific patterns that, when joined by minimal hardware, allow the flat elements to bend out of plane. The formation of sheet material joined by hardware can create an arrangement that avoids folding and. by doing so, makes use of the material's ability to deform and return to its original state. This ability has potential for a variety of applications, such as for systems that are dynamic, deployable, and easily transportable.

What we refer to as a deployable Kiriform flexure and methods for its fabrication and use are described herein, where various embodiments of the apparatus and methods may include some or all of the elements, features and steps described below.

In particular embodiments, a deployable Kiriform flexure includes first and second sections. The first section of the Kiriform flexure includes a plurality of curved fins arranged about a central axis. The second section of the Kiriform flexure includes a plurality of curved fins arranged about a central axis. Each fin of the second section is joined with a fin of the first section such that the first and second sections share a common central axis in a configuration that produces out-of-plane elastic buckling of the fins to actuate the Kiriform flexure from a substantially flat structure that extends substantially only in two dimensions orthogonal to the central axis to an expanded structure extending substantially in a third dimension parallel to the central axis (e.g., expanding in the third dimension by a distance that is at least an order of magnitude greater than the expansion in the third dimension of the structure in the substantially flat state) when at least one of the first and second sections is rotated relative to the other section.

In a method for three-dimensional actuation using a deployable Kiriform flexure comprising a first section of the Kiriform flexure including a plurality of curved fins arranged about a central axis and a second section of the Kiriform flexure comprising a plurality of curved fins arranged about a central axis, wherein each fin of the second section is joined with a fin of the first section such that the first and second sections share a common central axis. At least one of the first and second sections is rotated relative to the other section, and an out-of-plane elastic buckling of the fins is produced via that rotation to actuate the Kiriform flexure from a substantially flat structure that extends substantially only in two dimensions orthogonal to the central axis to an expanded structure extending substantially in a third dimension parallel to the central axis.

BRIEF DESCRIPTION OF THE DRAWINGS

FIG. 48 is a magnified photographic image showing joining of the fins 12 of the first and second layers at the notches 34 at the encircled locations in FIGS. 45 and 46.

FIGS. 49-51 illustrate the application of Kiriforms as wheels 48 for transport that can adapt from narrow configurations for high speed travel on a hard surface, as shown in FIGS. 49 and 50, to wide 'dirt' wheels, as shown in FIG. 51, to support additional traction and resistance in off-road conditions.

FIGS. 52-54 illustrate the application of a Kiriform 10 on a cell phone 52, which can integrate the Kiriform 10 as an accessory, such as a phone case or a camera lens adaptor (wherein the Kiriform 10 can include an additional lens or optical filter 54).

FIG. 57 also includes a bend sensor 60 between the electroluminescent film 58 and a PET sheet 56.

Figure 1:
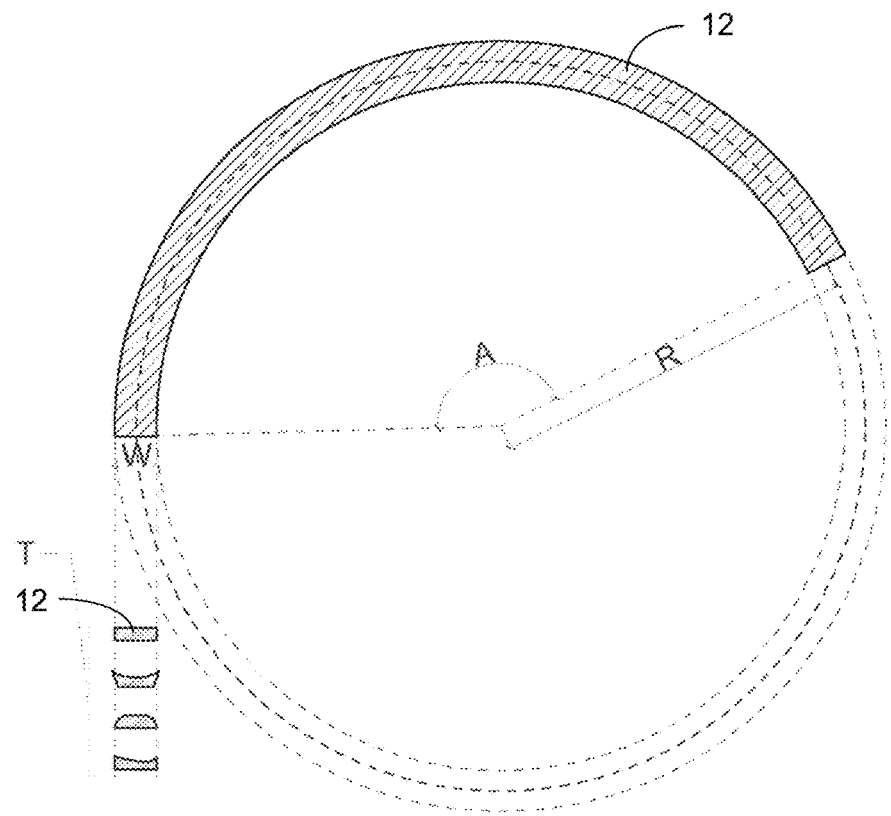
FIG. 1 shows the fin 12 of a Kiriform formed from a flat sheet and its cross section at lower left, as well as alternatives, below, for the cross section when the fins are shaped by other fabrication methods, with fin width (W), thickness (T), radius (R), and angle (A) illustrated.

In the accompanying drawings, like reference characters refer to the same or similar parts throughout the different views; and apostrophes are used to differentiate multiple instances of the same item or different embodiments of items sharing the same reference numeral. The drawings are not necessarily to scale; instead, an emphasis is placed upon illustrating particular principles in the exemplifications discussed below. For any drawings that include text (words, reference characters, and/or numbers), alternative versions of the drawings without the text are to be understood as being part of this disclosure; and formal replacement drawings without such text may be substituted therefor.

DETAILED DESCRIPTION

The foregoing and other features and advantages of various aspects of the invention(s) will be apparent from the following, more-particular description of various concepts and specific embodiments within the broader bounds of the invention(s). Various aspects of the subject matter introduced above and discussed in greater detail below may be implemented in any of numerous ways, as the subject matter is not limited to any particular manner of implementation. Examples of specific implementations and applications are provided primarily for illustrative purposes.

Unless otherwise herein defined, used or characterized, terms that are used herein (including technical and scientific terms) are to be interpreted as having a meaning that is consistent with their accepted meaning in the context of the relevant art and are not to be interpreted in an idealized or overly formal sense unless expressly so defined herein. For example, if a particular composition is referenced, the composition may be substantially (though not perfectly) pure, as practical and imperfect realities may apply; e.g., the potential presence of at least trace impurities (e.g., at less than 1 or 2%) can be understood as being within the scope of the description. Likewise, if a particular shape is referenced, the shape is intended to include imperfect variations from ideal shapes, e.g., due to manufacturing tolerances. Percentages or concentrations expressed herein can be in terms of weight or volume. Processes, procedures and phenomena described below can occur at ambient pressure (e.g., about 50-120 kPa—for example, about 90-110 kPa) and temperature (e.g., −20 to 50° C.—for example, about 10-35° C.) unless otherwise specified.

Although the terms, first, second, third, etc., may be used herein to describe various elements, these elements are not to be limited by these terms. These terms are simply used to distinguish one element from another. Thus, a first element, discussed below, could be termed a second element without departing from the teachings of the exemplary embodiments.

Spatially relative terms, such as "above," "below," "left," "right," "in front," "behind," and the like, may be used herein for ease of description to describe the relationship of one element to another element, as illustrated in the figures. It will be understood that the spatially relative terms, as well as the illustrated configurations, are intended to encompass different orientations of the apparatus in use or operation in addition to the orientations described herein and depicted in the figures. For example, if the apparatus in the figures is turned over, elements described as "below" or "beneath" other elements or features would then be oriented "above" the other elements or features. Thus, the exemplary term, "above," may encompass both an orientation of above and below. The apparatus may be otherwise oriented (e.g., rotated 90 degrees or at other orientations) and the spatially relative descriptors used herein interpreted accordingly.

Further still, in this disclosure, when an element is referred to as being "on," "connected to," "coupled to," "in contact with," etc., another element, it may be directly on, connected to, coupled to, or in contact with the other element or intervening elements may be present unless otherwise specified.

The terminology used herein is for the purpose of describing particular embodiments and is not intended to be limiting of exemplary embodiments. As used herein, singular forms, such as "a" and "an," are intended to include the plural forms as well, unless the context indicates otherwise. Additionally, the terms, "includes," "including," "comprises" and "comprising," specify the presence of the stated elements or steps but do not preclude the presence or addition of one or more other elements or steps.

Additionally, the various components identified herein can be provided in an assembled and finished form; or some or all of the components can be packaged together and marketed as a kit with instructions (e.g., in written, video or audio form) for assembly and/or modification by a customer to produce a finished product.

The production of the structures described herein, which we call Kiriform, uses a technique of kirigami by cutting out radially symmetrical geometries and joining them. Rather than allowing sheet material to be folded and permanently altered; in this case, sheet material with certain material properties is chosen such that it resists folding so that each element can bend and then return to its original shape. In another embodiment, there can be a changing cross section within the whole structure, where the fins 12 (shown in FIG. 1) have a shaped cross section, and the outer (perimeter) rings 14 (see FIG. 2) can be flat with a gradient at their point of interface.

Figure 3:
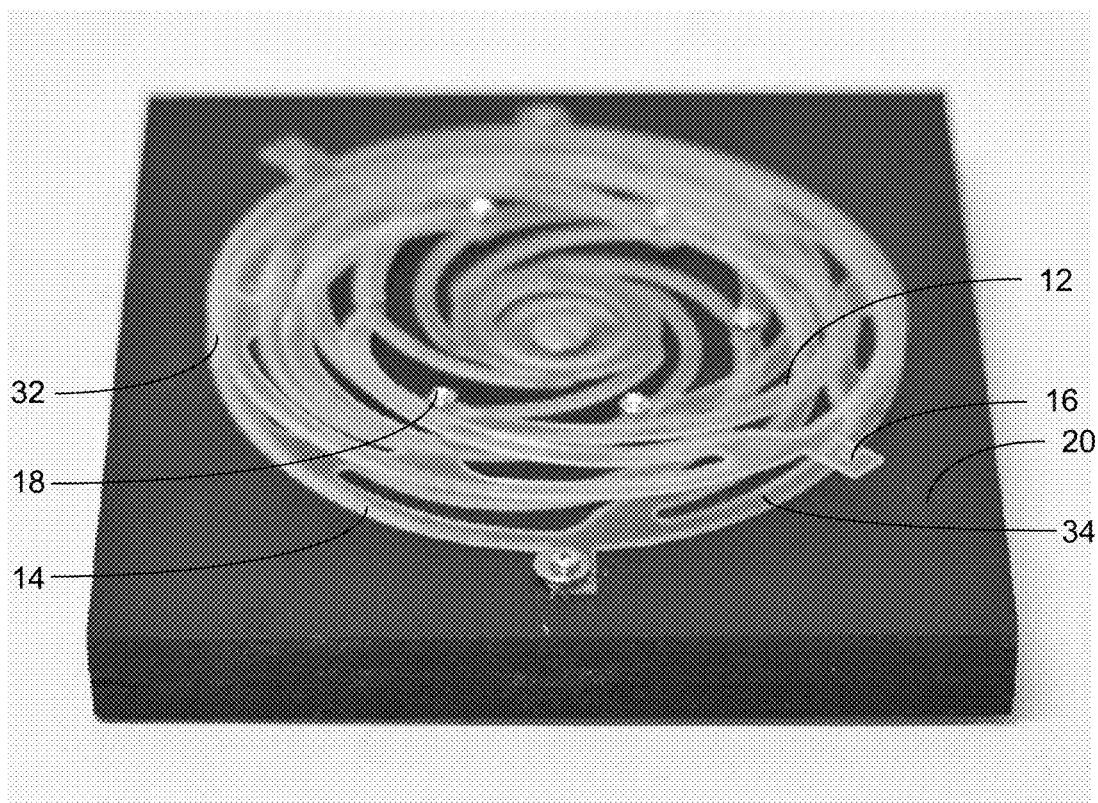
FIGS. 3 and 4 show another embodiment of a hemispherical Kiriform, in an unactuated state (FIG. 3) and after actuation via rotation of the top section 32 of the Kiriform relative to the bottom section 34 of the Kiriform along with a spring shaped tie attached to the ground plane 20 (FIG. 4).
Figure 4:
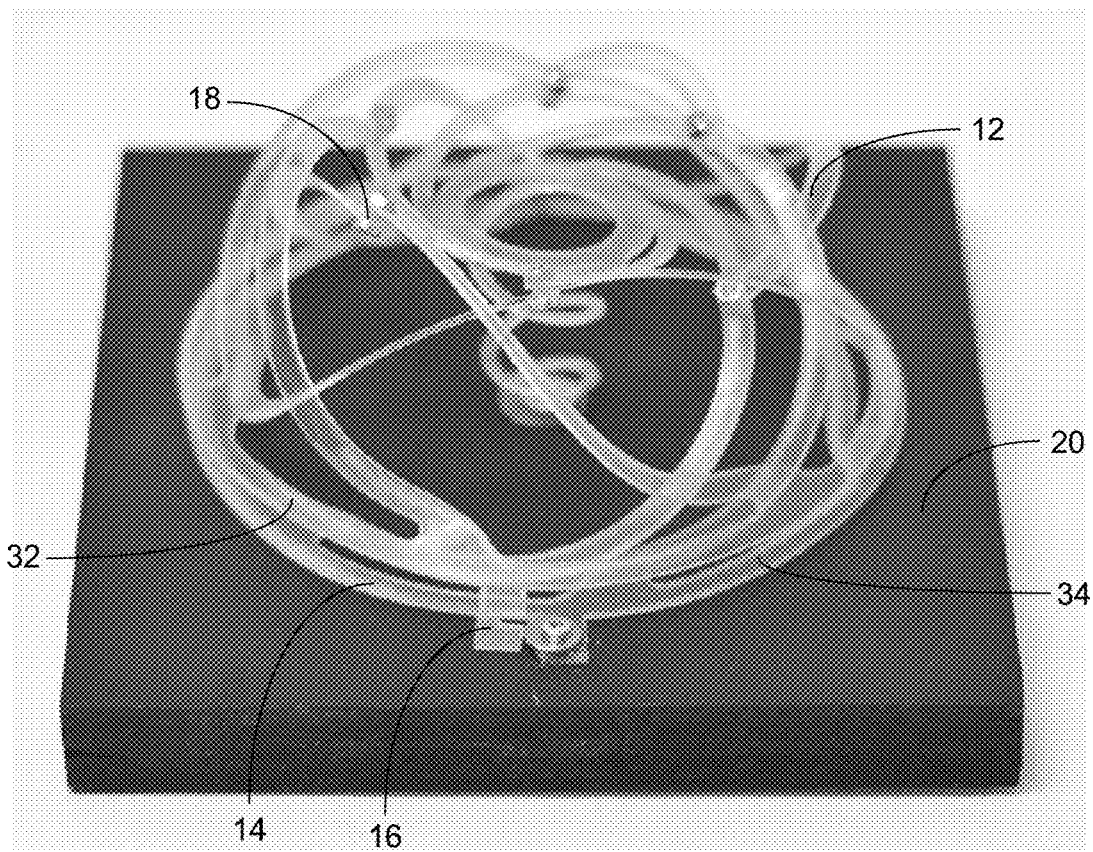
Figure 5:
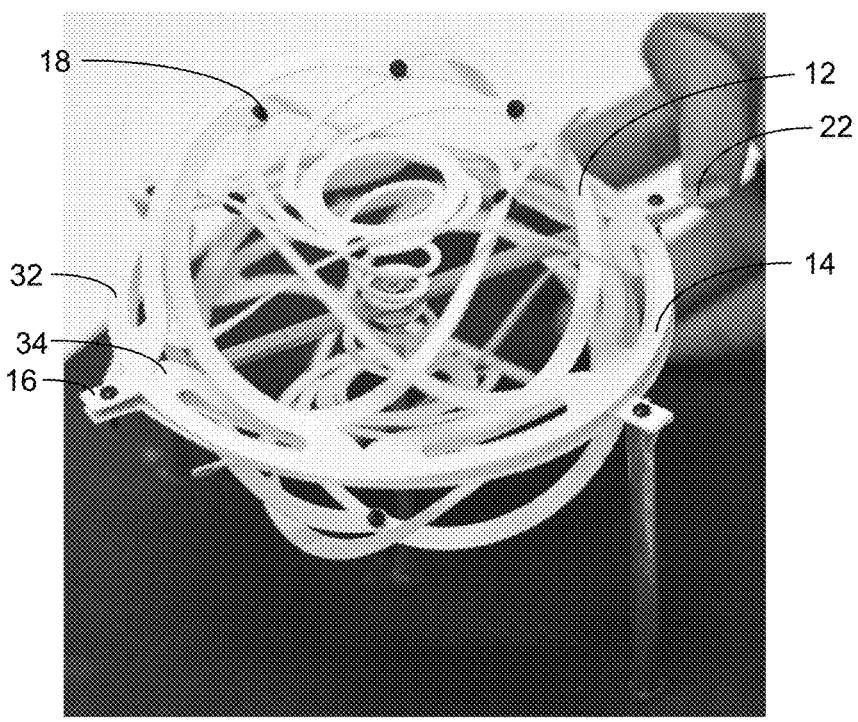
FIG. 5 shows an embodiment of a Kiriform actuated by rotating the top section 32 of the Kiriform with an operator's finger providing a tangential force on a rotatable actuation lever 22 fixed to a tab 16 protruding from the perimeter 14 of the top section 32, as shown, relative to the fixed bottom section 34, wherein that rotation is translated into vertical displacement of the top-and-bottom joined fins 12 as the fins 12 buckle due to the rotation.

As shown in FIGS. 3 and 4, the Kiriform can include first (top) and second (bottom) sections 32 and 34, wherein the fins 12 of the first section 32 are joined in opposition with the fins 12 of the second section 34 via a bonding mechanism (e.g., a screw). When a certain amount of tangential load is applied to the system (e.g., via a rotational force imparted upon one or more tabs 16 extending from the perimeter ring 14), the material components (e.g., fins 12) start to buckle and the entire shape translates from two dimensions to three dimensions as it occupies space, as seen in FIGS. 4 and 5. The tangential force is converted into a linear motion in the z axis due to this buckling effect.

Figure 6:
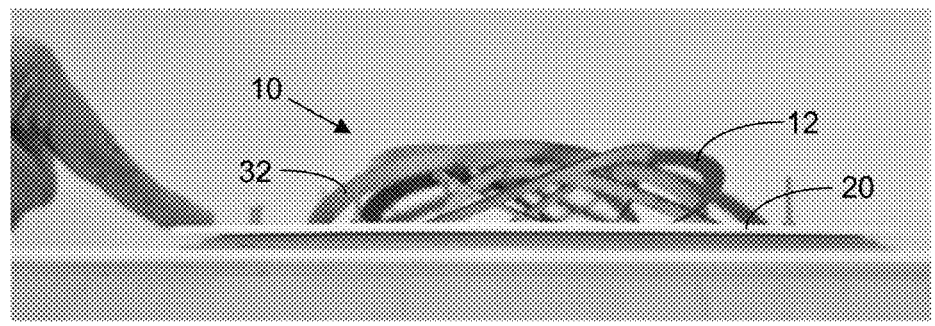
FIGS. 6-8 show three modes of Kiriform actuation: clock-wise rotation of the top section 32 (FIG. 6), static (FIG. 7), and counter-clock-wise rotation of the top section 32 (FIG. 8) in the elevation view.
Figure 7:
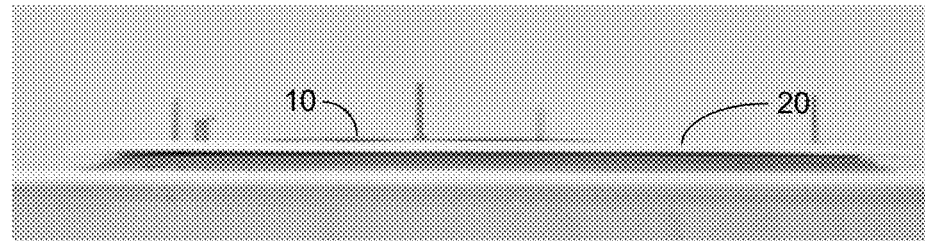
Figure 8:
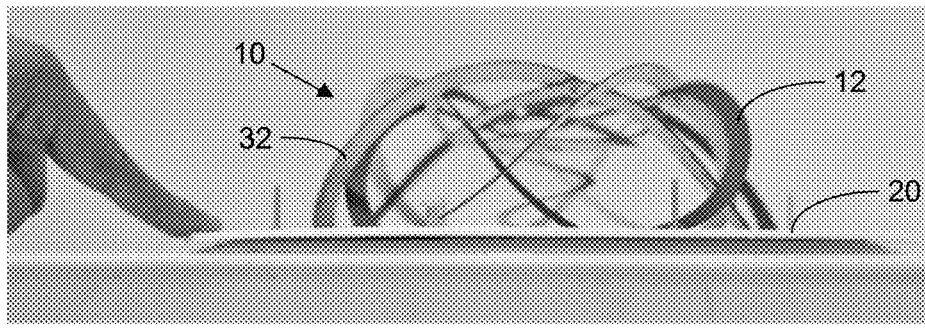
Figure 9:
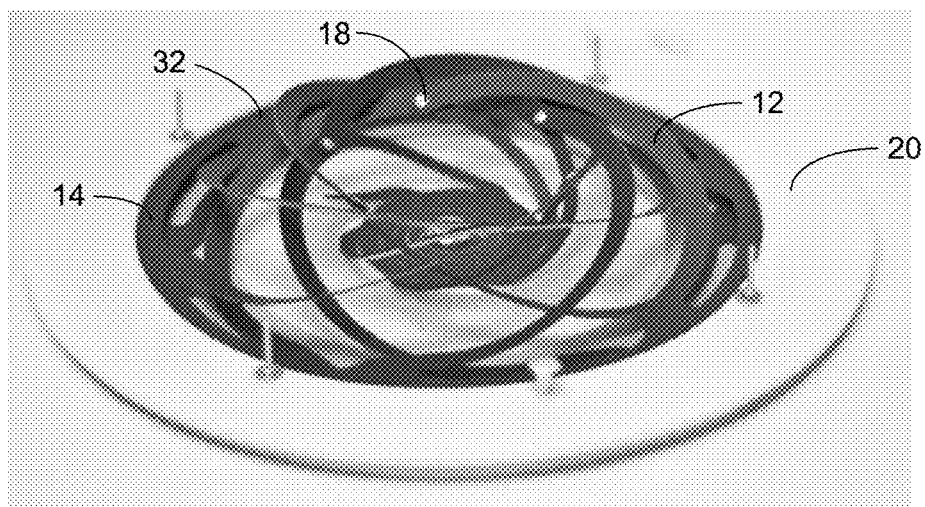
FIGS. 9-11 show the corresponding three modes of Kiriform actuation: clock-wise rotation of the top section 32 (FIG. 9), static (FIG. 10), and counter-clock-wise rotation of the top section 32 (FIG. 11) in a 3D view.
Figure 10:
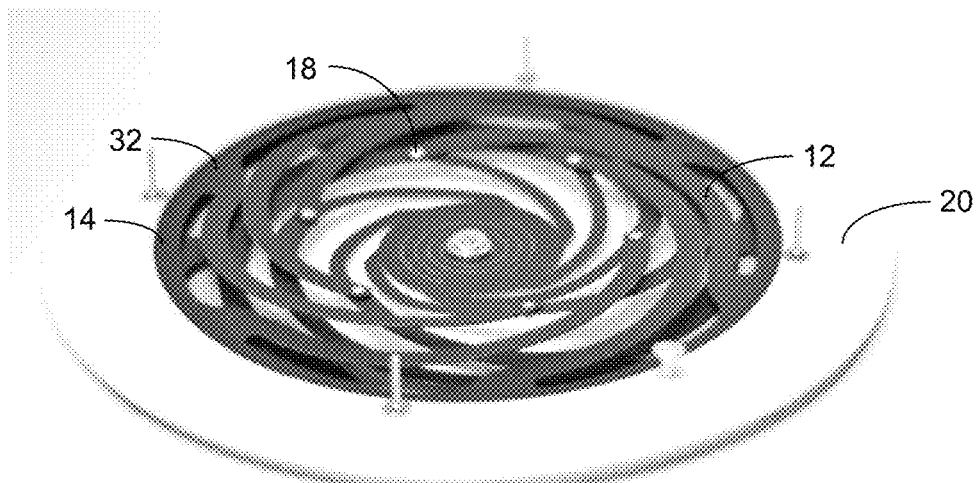
Figure 11:
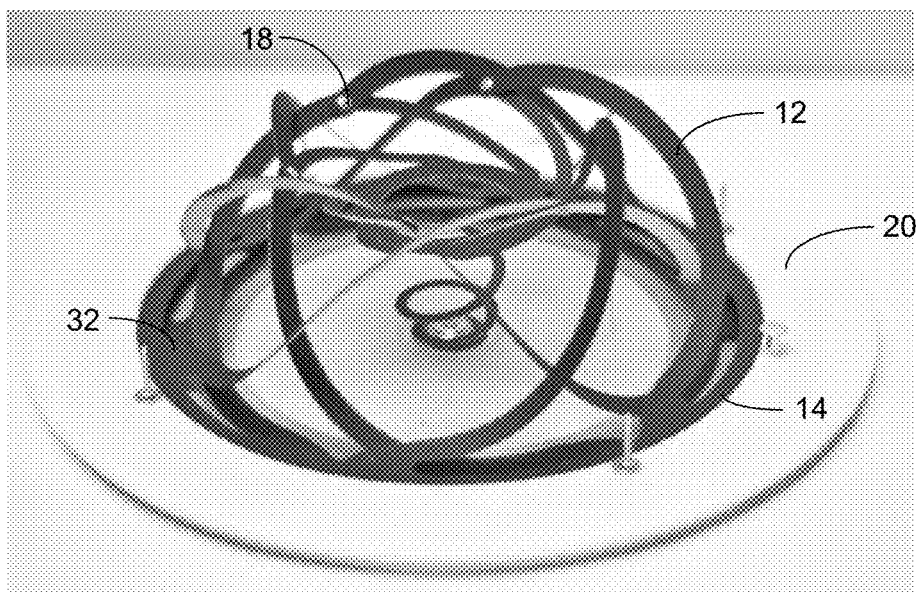
Figure 12:
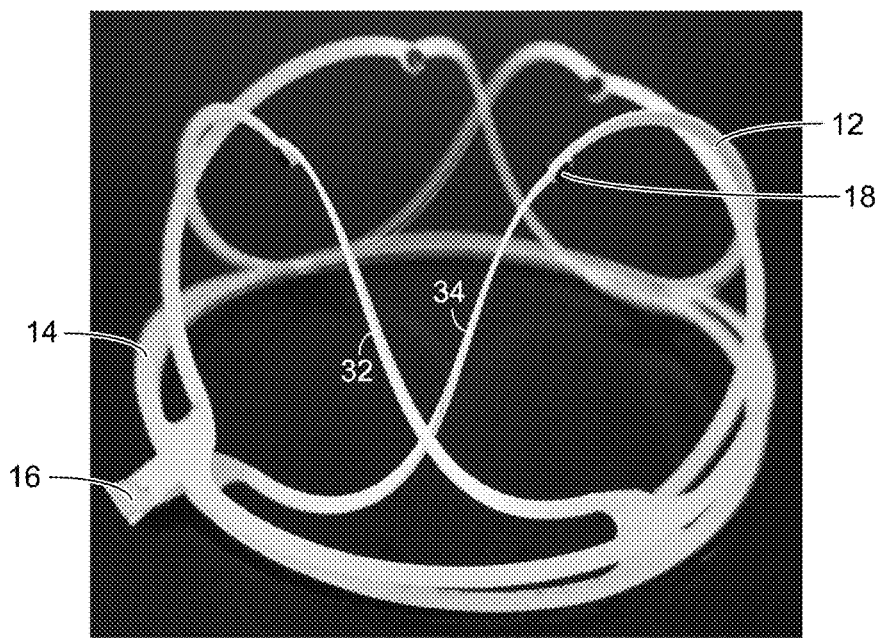
FIGS. 12-16 show un-actuated (FIGS. 13 and 15) and actuated (FIGS. 12, 14, and 16) embodiments of a Kiriform.
Figure 13:
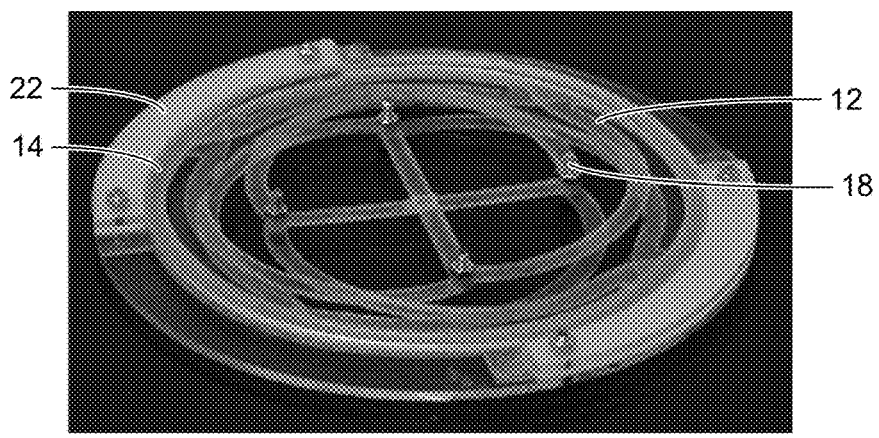
Figure 14:
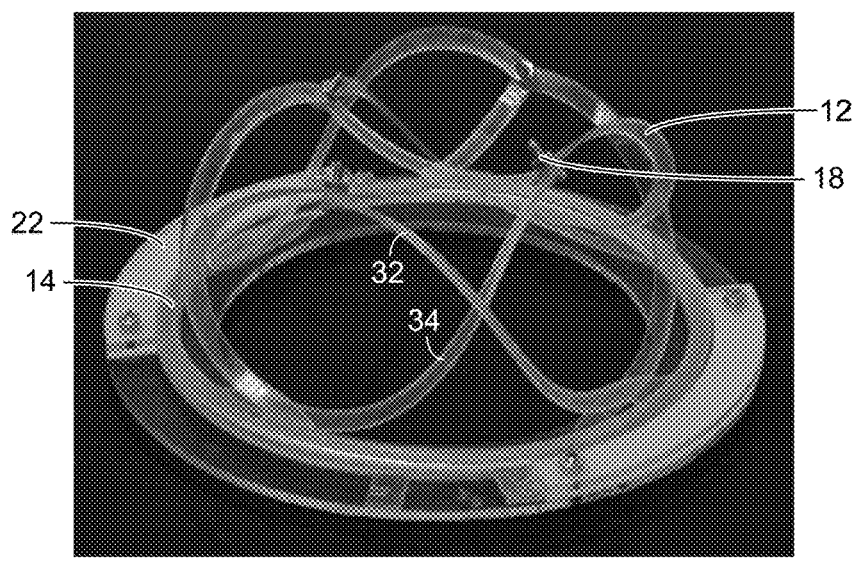
Figure 15:
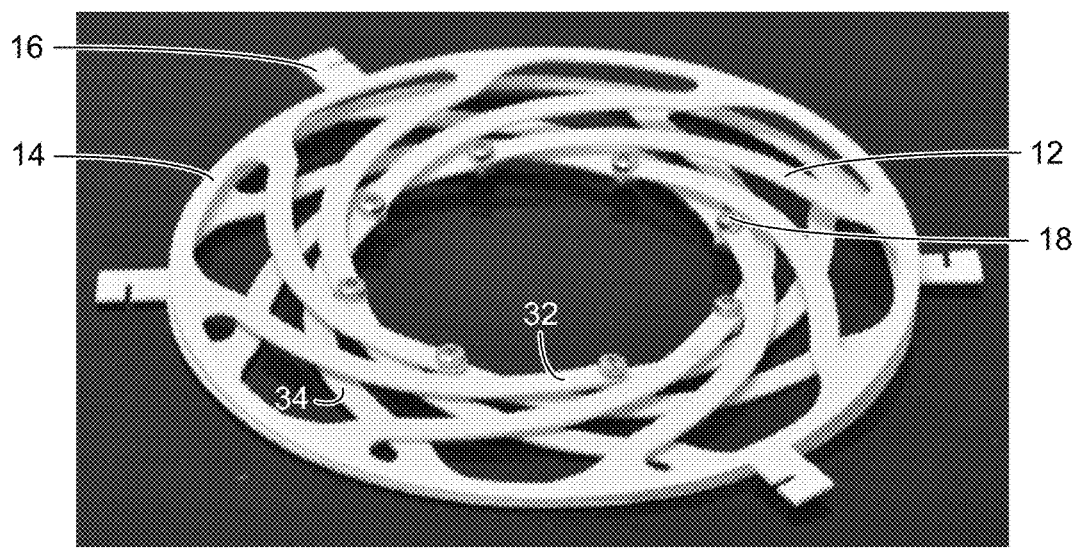
Figure 16:
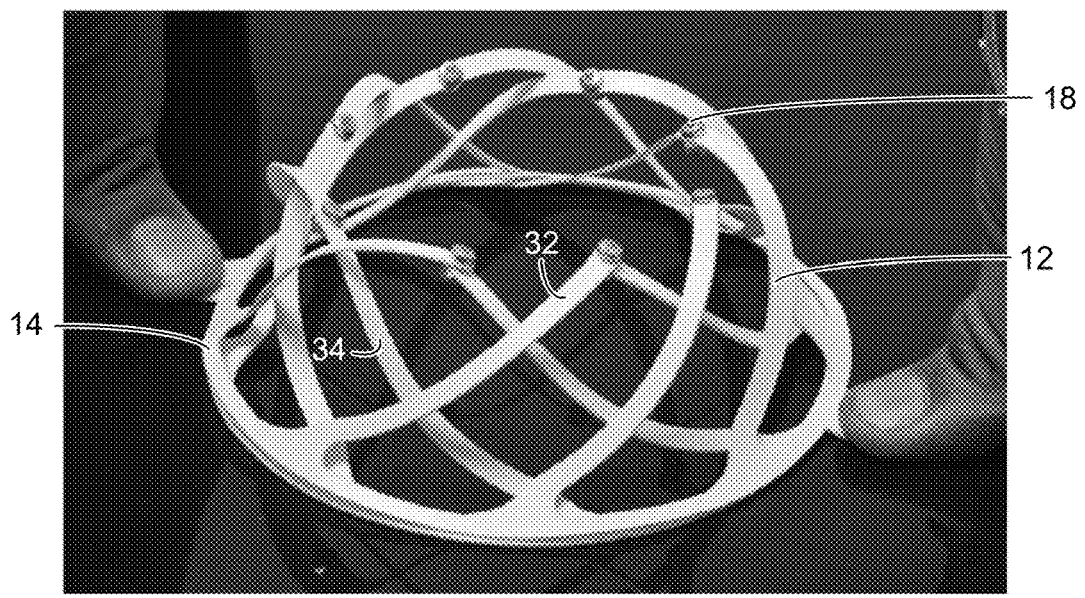
Figure 31:
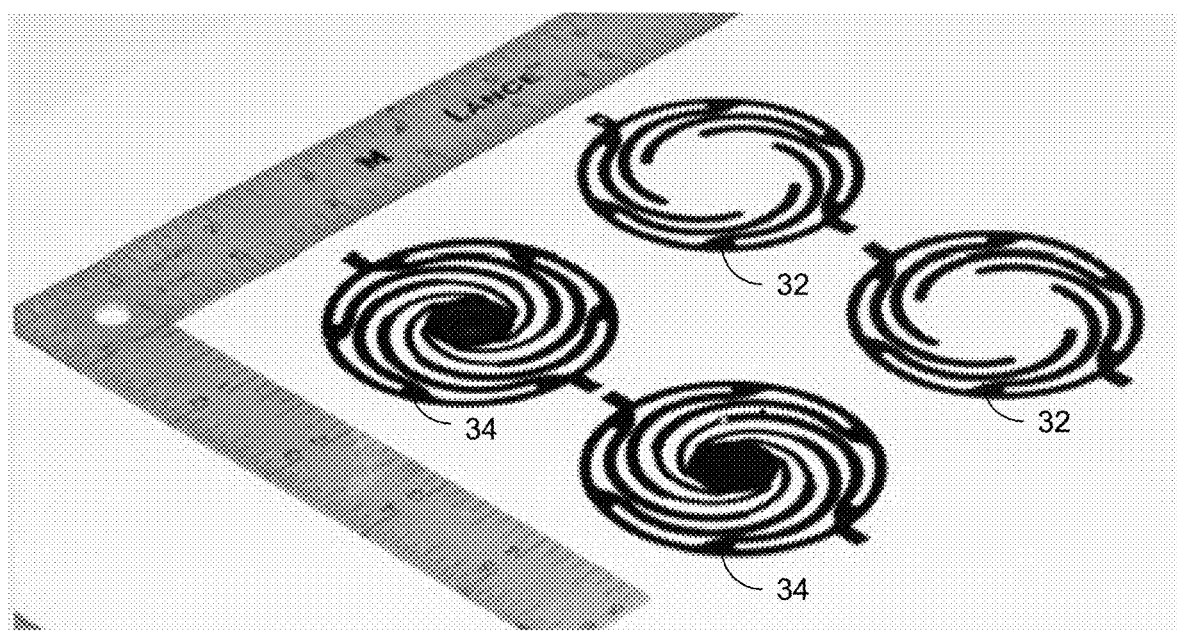
FIG. 31 shows the basic components of a spherical Kiriform structure (with a diameter of about 2 inches)
Figure 32:
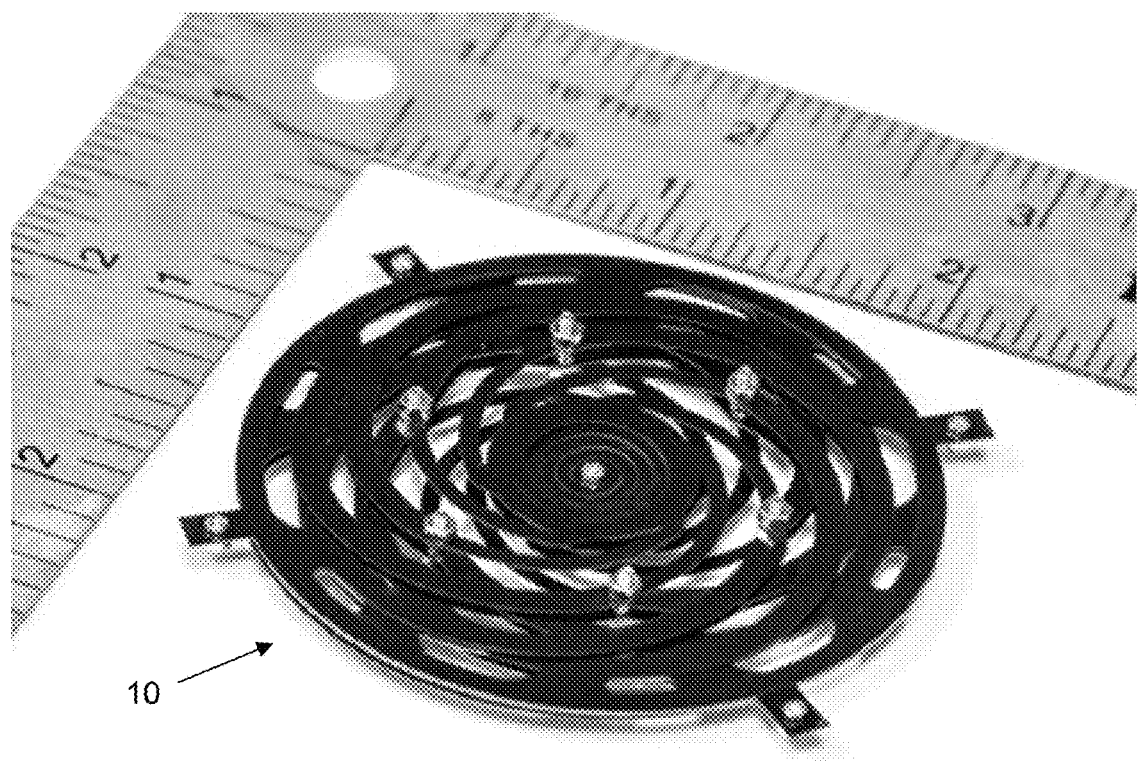
FIGS. 32-36 show the Kiriform structure 10 in various actuation states.
Figure 33:
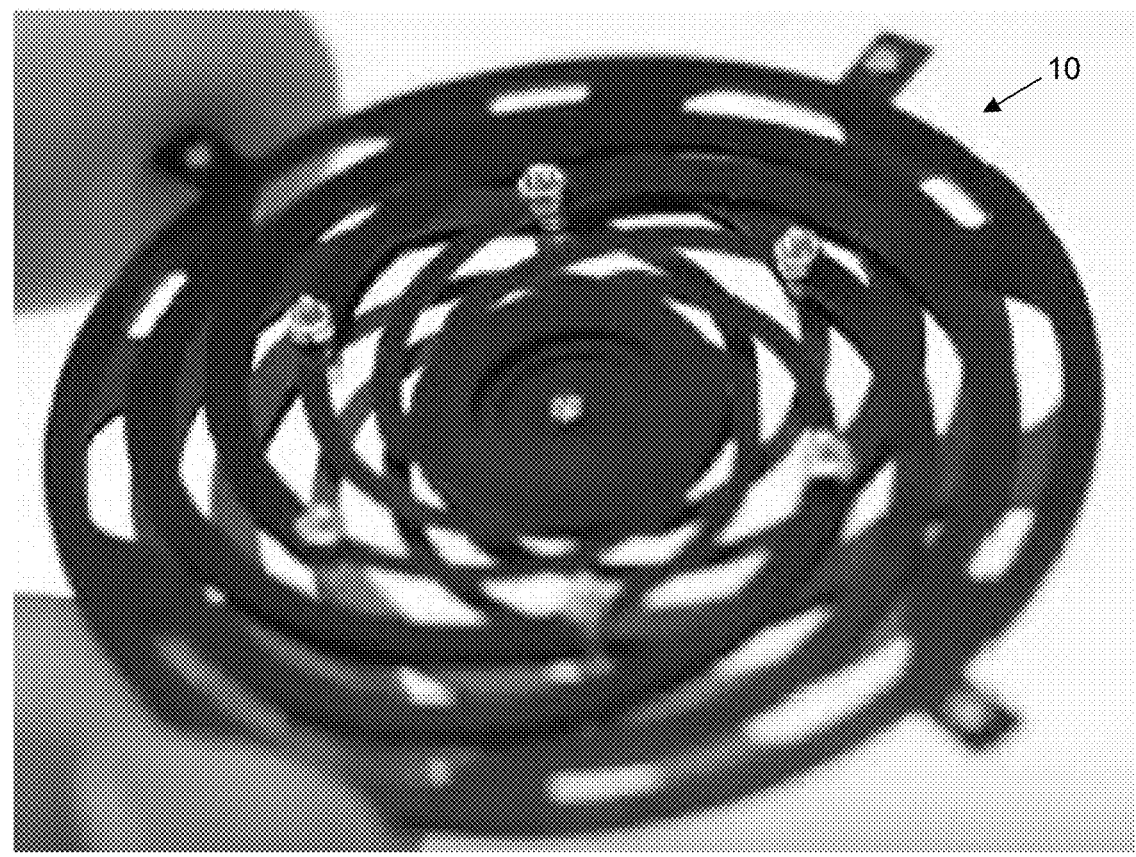
Figure 34:
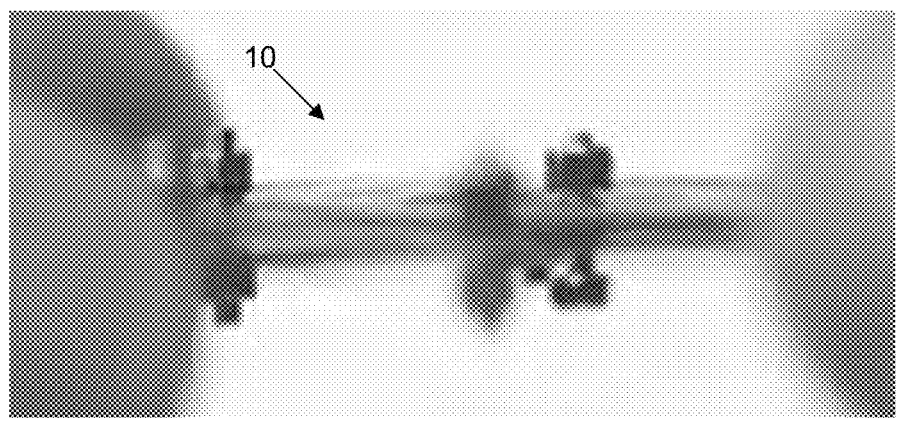
Figure 35:
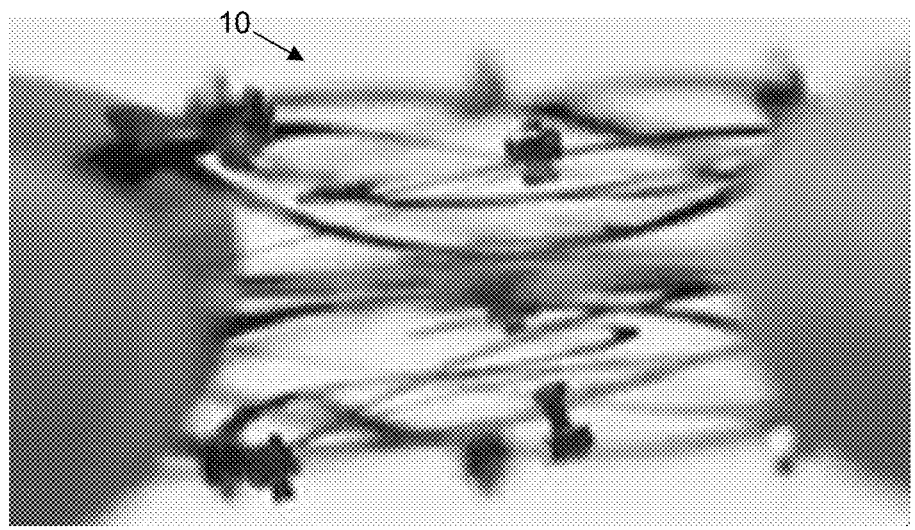
Figure 36:
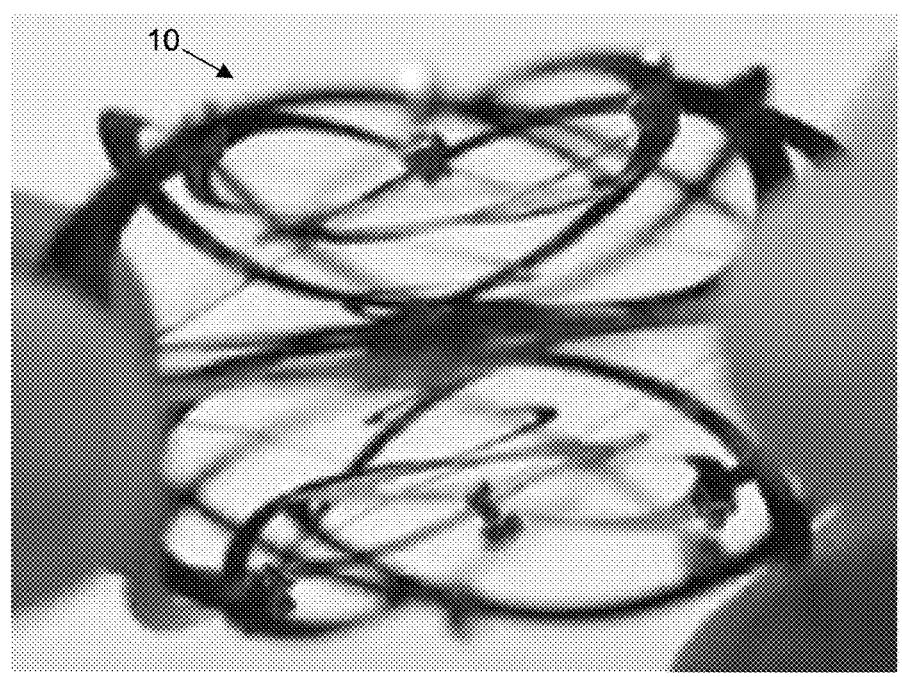

The mechanism has the following three states: static (shown in FIG. 7), clockwise rotation (shown in FIG. 6), and counterclockwise rotation (shown in FIG. 8) of a rotatable top section connected to a bottom section mounted to ground plane or other fixed structure 20. The force, which can be provided by an operator's finger against a rotatable actuation structure 22 (as shown in FIGS. 5, 6, and 8) for deployment is dependant on the number of fins 12 and the ratio of the width to the thickness of individual fins 12, as well as the sheet material used. FIGS. 9-11 likewise show the corresponding three modes of Kiriform actuation: clock-wise rotation of the top section 32 (see FIG. 9), static (see FIG. 10), and counter-clock-wise rotation of the top section 32 (see FIG. 11) in a 3D view. Further still, FIGS. 13 and 15 show unactuated embodiments of a Kiriform, while FIGS. 12, 14, and 16 show actuated embodiments of the Kiriform. Sequential degrees of actuation of a Kiriform via rotation of the top section 32 of the Kiriform are shown in FIGS. 23-26. Various actuation of states of a spherical Kiriform (fabricated from the sections 32 and 34 shown in FIG. 31) are shown in FIGS. 32-36.

Figure 27:
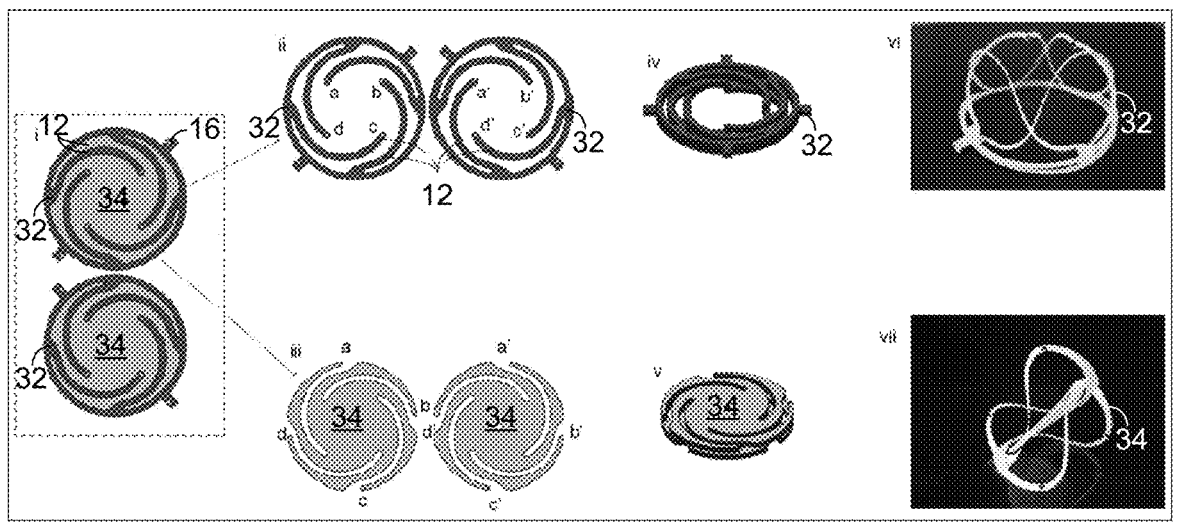
FIG. 27 shows positive 32 and negative 34 sections, which can serve respectively as top and bottom sections or vice versa, that are cut from the same sheet (i) to facilitate two different actuation mechanisms. The two positive sections 32 (oriented with oppositely arcing fins 12 and joined with their fins 12 respectively secured by bonding mechanisms 18 are shown in (ii), while the two negative sections 34 are similarly mounted and joined, as shown in (iii). The positive and negative sections 32 and 34 are respectively stacked, as shown in (iv) and (v). Actuation via respective rotation of the positive and negative sections 32 and 34 is shown in (vi) and (vii).
Figure 28:
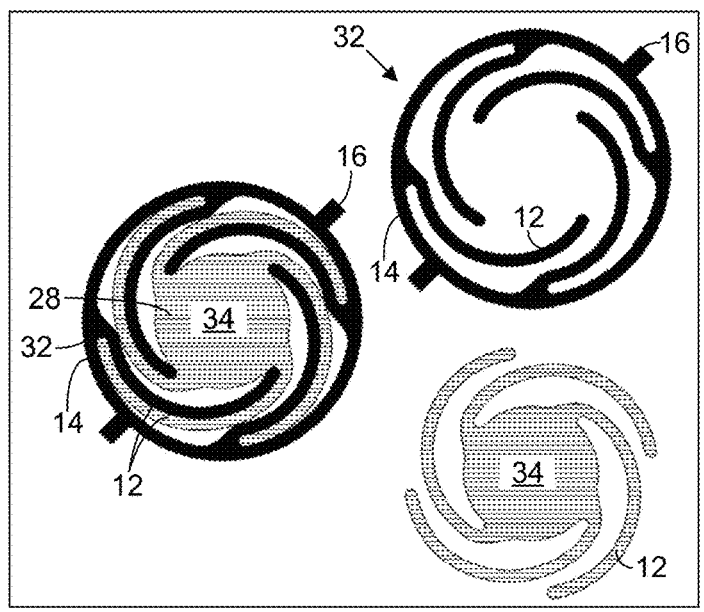
FIG. 28 shows another embodiment of positive 32 and negative 34 sections with equal fin widths for Kiriform cut from the same sheet.
Figure 37:
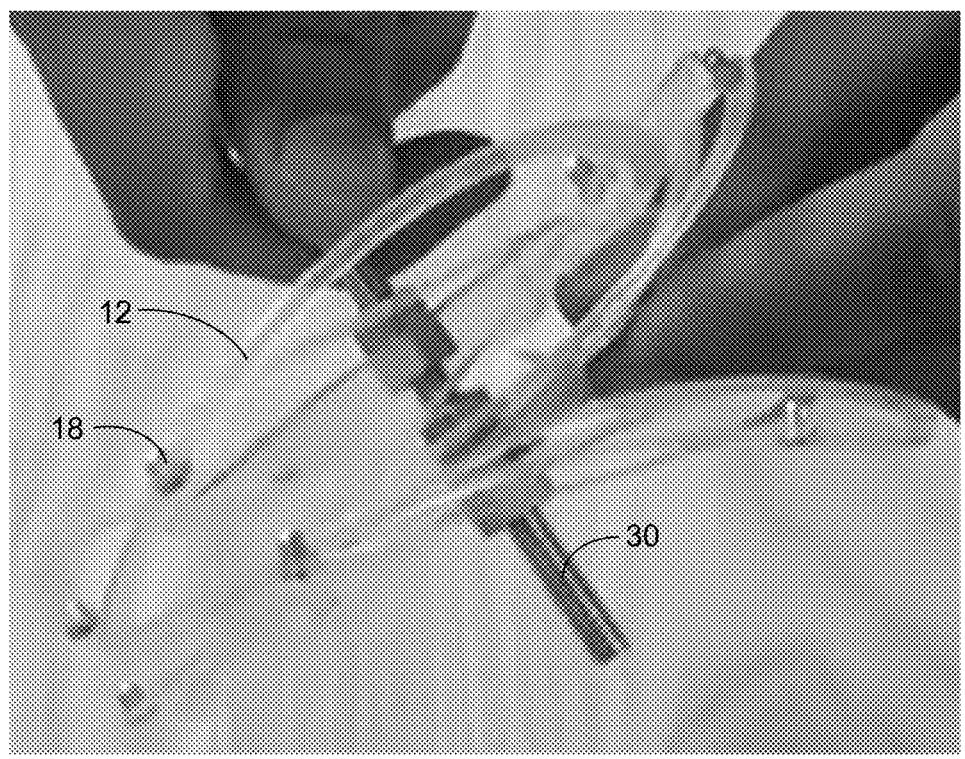
FIGS. 37 and 38 show an internally actuated Kiriform structure that is actuated via rotation of an internal screw 30, as shown (with the top hand rotated counter-clockwise).
Figure 38:
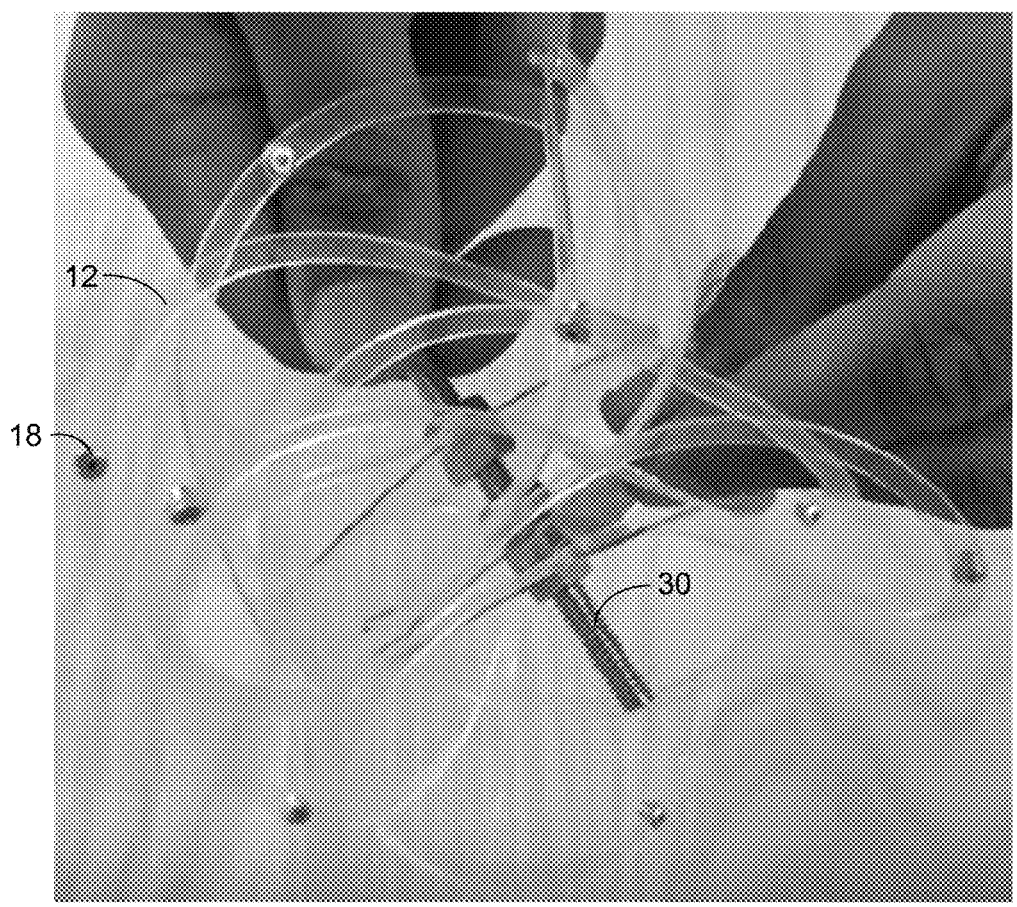

As shown in FIGS. 27 and 28, the first and second sections 32 and 34 of the Kiriform can be cut as positive and negative sections, respectively, from a single sheet of material, and the fins from the two sections are then joined by bonding mechanisms 18 in the form of, e.g., screws and nuts, rivets, or adhesive, at securing points a-a', b-b', c-c', and d-d'). The first section 32 is rotated via tabs 16 at its perimeter, while the second section 34 is rotated along its central axis. An embodiment of a Kiriform structure that is internally actuated via rotation of a central shaft 30 (here, in the form of a screw) is shown in FIGS. 37 and 38, where the Kiriform is actuated to expand via counter-clockwise rotation via the top hand in images shown.

Figure 2:
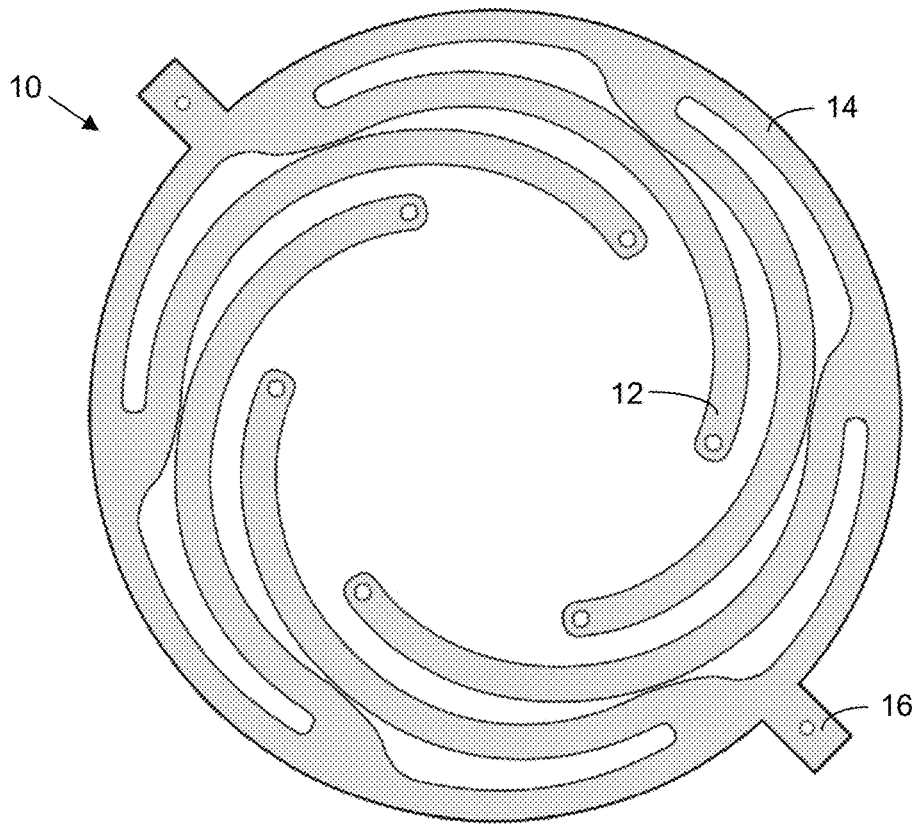
FIG. 2 shows a basic unit of a Kiriform. Two of these units make a hemispherical Kiriform and four of these units make a spherical Kiriform.

With new fabrication technologies and their enabling modeling and drawing software, such as 3D printing, sheet material contouring can achieve higher efficiency and ease in producing curved shapes. The method we use, which we call Kiriform, can use curved fins 12, as shown in FIG. 2, rather than relying on straight-line folds. The production of Kiriform through the use of 3D printing allows for designs that are both scalable and replicable, broadening its potential for use in emergency situations in which rapid production and assembly is required. The fabrication process also allows for the same template to be used for different materials and resized when required to scale up or down. Kiriform can be composed for a more temporary lifespan, or composed for a longer lifespan in which permanence requires it to be made to be more robust.

Comparable designs using sheet material often require bi-directional linear force to transform a material system from a two-dimensional to a three-dimensional state. Kiriform is a self-contained system that rotates around a central point, and requires torsional force. Its organization is that of interlocking, "fins" that, in particular designs, have curved profiles in plan view. The result of transforming the Kiriform from one state to another effectively translates rotational force to linear force. Collapsing a deployed Kiriform in its three-dimensional state would involve linear force and result in rotational movement to return back to its two-dimensional state. An advantage of Kiriform includes this difference in force and movement translation. Kiriform can be propagated over a surface in a patterned repetition, or it can be repeated in a linear arrangement such that there is an extreme difference between a collapsed, two-dimensional and expanded, three-dimensional state. Kiriform can also be easily scaled up or down, and the material integrity calibrated such that the operation remains the same.

Kiriform can be considered as a minimal design in its economy of material relative to its expansive, volumetric transformation. It has the capacity to play a role in many different kinds of configurations and systems. Another advantage to the Kiriform design is that it can be doubled such that a half-spherical volume can be deployed on either side of a two-dimensional state. Likewise, Kiriform can be interlocked in various ways, one to another. If replicated and interlocked in a linear series, the amount of volume achieved can be significant in its scope.

Figure 17:
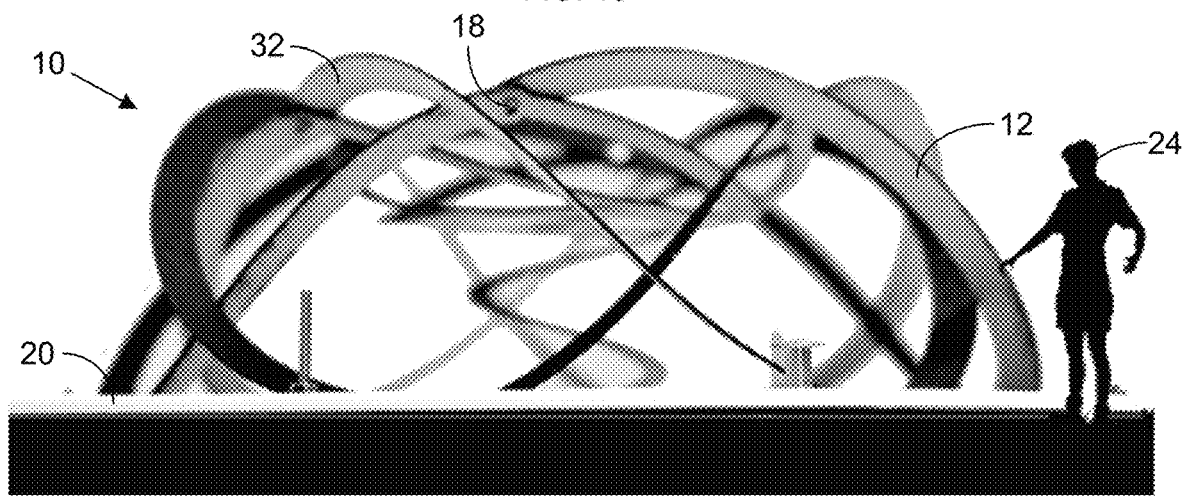
FIG. 17 shows an actuated Kiriform structure 10, wherein the actuated Kiriform 10, as shown, can serve as a framework for a deployable enclosure (e.g., a shelter or tent for humans 24).

Various design parameters of the Kiriform include scale, material, material thickness, feature dimension, friction, and connection type and counter ties. The methods described herein facilitate ease of fabrication expands the design domain of deployable objects of various scales ranging from medical devices (such as the biased Kiriform shown in FIG. 18, which can be used in medical devices, such as endoscopes and stents, to navigate through internal passageways of the body—or which can be used to change camera angles) to enveloping, 3D architecture, as shown in FIG. 17. Small-scale Kiriforms can be fabricated using pop-up laminate fabrication techniques, as described in U.S. Pat. No. 8,834, 666 B2, "Monolithic Fabrication of Three-Dimensional Structures" (Harvard).

Figure 39:
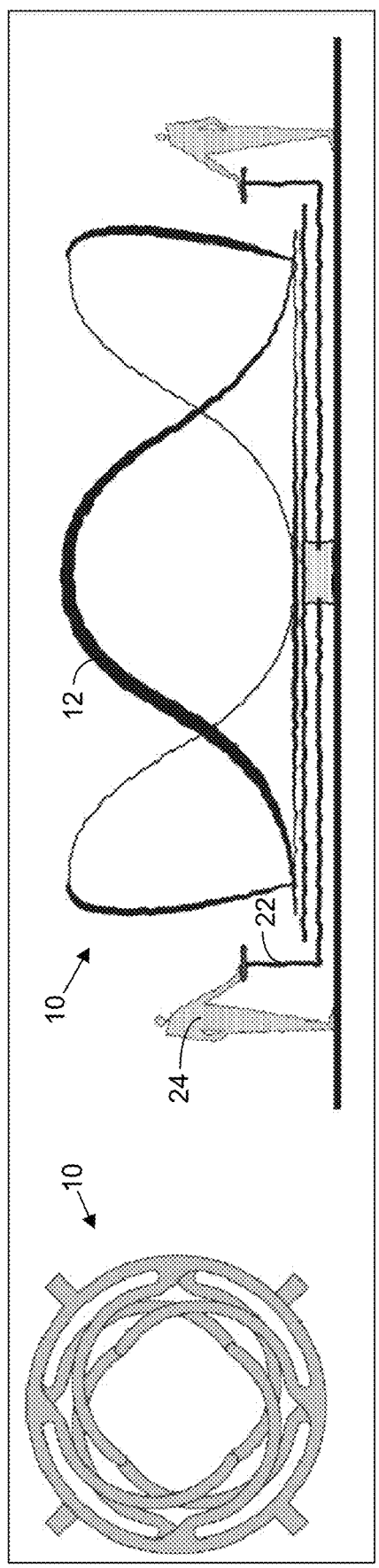
FIGS. 39 and 40 show large-scale Kiriform structures 10 with peripheral and internal actuation, respectively, as shown, to produce a human-scale enclosure.
Figure 40:
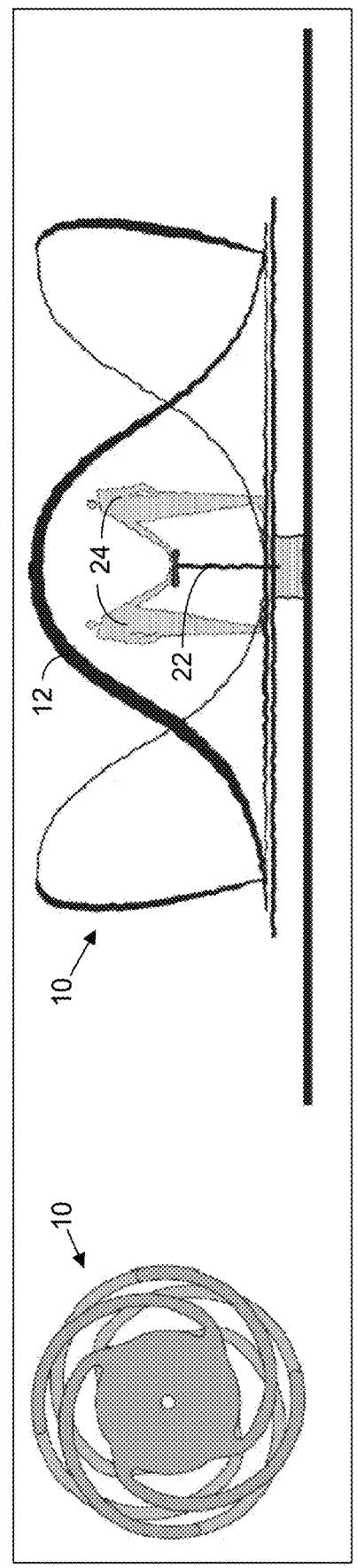
Figure 74:
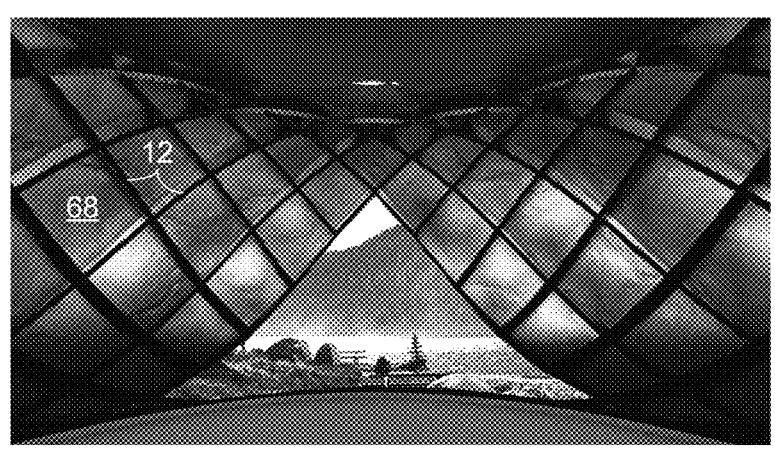
FIG. 74 shows a Kiriform that serves as a human enclosure, as in FIG. 17, with a fabric 68 secured to the Kiriform 10 to provide a more-complete enclosure.

When used as an architectural enclosure, the bottom section of the Kiriform 10 can be secured to the ground 20 via stakes driven into the ground through orifices in tabs 16 extending from the bottom section 34, while humans or a mechanism rotate the top section 32 to "pop-up" the enclosure (see FIGS. 3 and 4 for illustration of the top and bottom sections 32 and 34). In this embodiment and in others, a fabric or membrane can be secured to or draped over the Kiriform 10 to provide a more-complete enclosure, as shown in FIG. 74. Additionally, large-scale Kiriform structures 10 with peripheral and internal actuation, respectively, to produce a human-scale enclosure are shown in FIGS. 39 and 40.

The Kiriform componentry can include sheet material and hardware joints formed into a system of movement that has three states that it moves between. One state is flat, with all of the material collapsed down. The other two states are that of a three-dimensional volume, with a dynamic transformation during the transition from one state to another. This componentry can be repeated, scaled up, and combined, and it can participate in larger systems.

This componentry can distribute force over wider areas of material such that no one point folds when force is applied, resulting in a deliberate buckling of the fins out of plane. This design essentially converts rotational to linear motion by relying on material properties and calibrating points of connection and, therefore, the distribution of force. This design also uses a material that is flexible while still returning to its original shape after being deformed. Therefore, the material is elastic rather than brittle, yet it has enough bending strength to distribute force rather than pinching and bending at a local point. The method of joining these sheet-cut elements is also calibrated to be robust enough to withstand actuation—to deploy and collapse repeatedly while allowing for motion.

The "fins," or shapes cut out of sheet material, 3-D printed or made as shaped fins, lay in a particular, lapped arrangement when the overall system is flat. Minimal joinery can be used—standard hardware, aluminum rivets, welding, gluing or a method of crimping is suitable for joining the fins. Where the Kiriform structure is fabricated via 3D printing, the fins of the two sections can be integrally and seamlessly joined in a unified structure (with no clear division between the joined fins of the two sections).

These sets of components then can be affixed to a planar substrate 20 and can expand off of that base. This planar substrate 20 can be a material with an aperture cut out, such that the Kiriform acts as a light-mediating oculus. Depending on the arrangement and number of Kiriform affixed to a substrate, the Kiriform fins can expand out from the datum of the surface, or the surface can expand out from the central point of the Kiriform. The planar substrate can also be designed as a standalone object, such that the entire half-sphere or doubled, full-sphere Kiriform is discrete.

Figure 41:
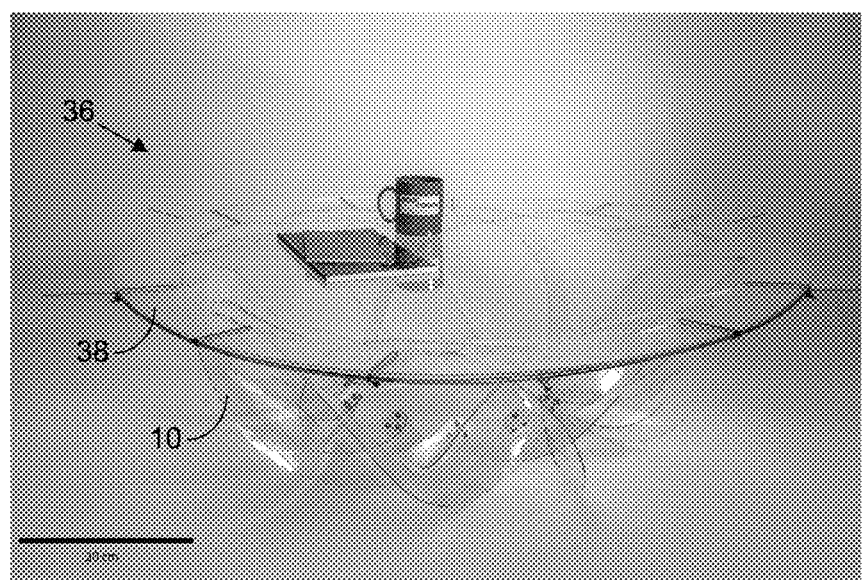
FIGS. 41 and 42 illustrate the wide scale range for the size of Kiriform structures, including a table 36 with a diameter of 1.2 m and a medical device 40 with a diameter of 6 mm (alongside a US penny for scale).
Figure 42:
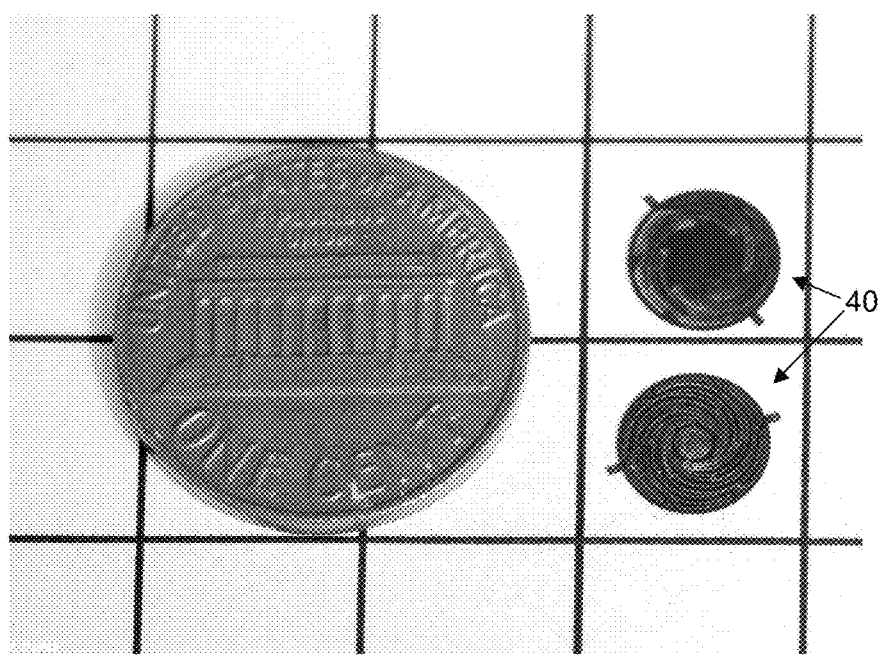

In various embodiments, the Kiriform can be produced using substantially the same design over a broad range of sizes. For example, a table 36 (for use by humans to, e.g., sit around) with a diameter of 1.2 m is shown in FIG. 41, while a medical device 40 with a diameter of 6 mm is shown in FIG. 42. The table 36 is formed of PET plastic and can serve as a coffee table. The table 36 can be deployed to its form by one or two people and locked into place with the help of pins or other fastening mechanisms. In this form, the table 36 can hold a weight of 8 kg, and its stability can be improved by changes to its geometric form, such as via addition of a center-tie and/or notches in the fins, as described below. This table 36 and other furniture incorporating Kiriforms 10 can be adjustable in height (or along other dimensions) by varying the degree of actuation of the fins 12 of the Kiriform 10, and the furniture can then be locked in place (by locking the relative positions of the fins 12) at the desired height.

Figure 43:
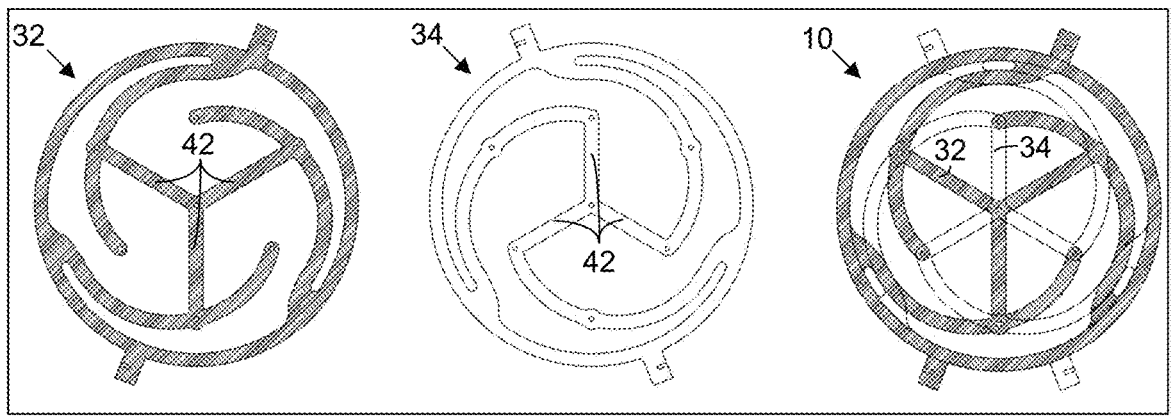
FIGS. 43 and 44 show that the open center of the Kiriform 10 shown in earlier embodiments can be tied across with short struts 42 to improve stability in its expanded state.
Figure 44:
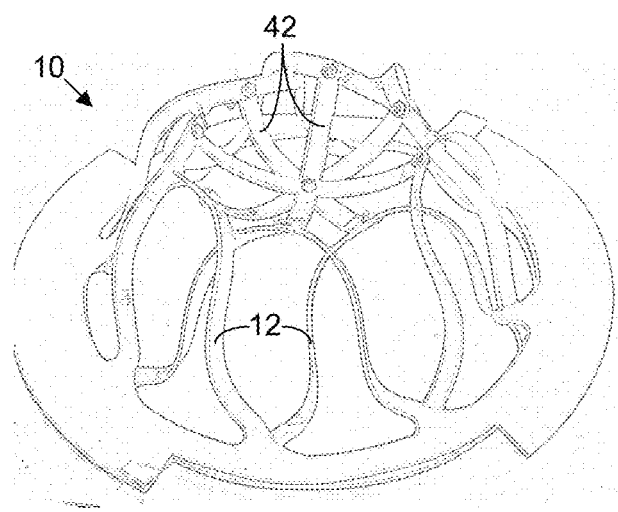
Figure 45:
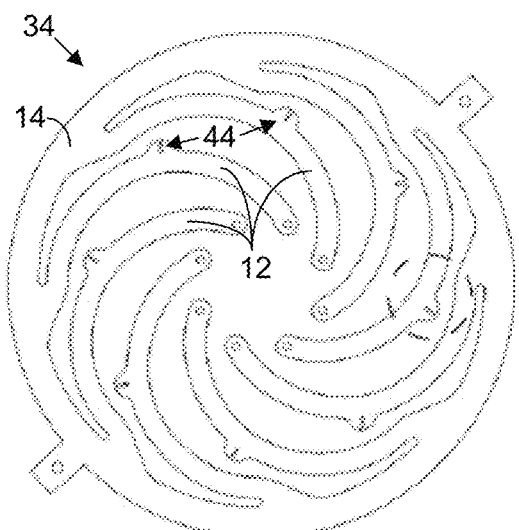
FIGS. 45-48 show a Kiriform 10 with stability notches 44 added at various lengths along the fins 12 to freeze the Kiriform 10 in its expanded shape.
Figure 46:
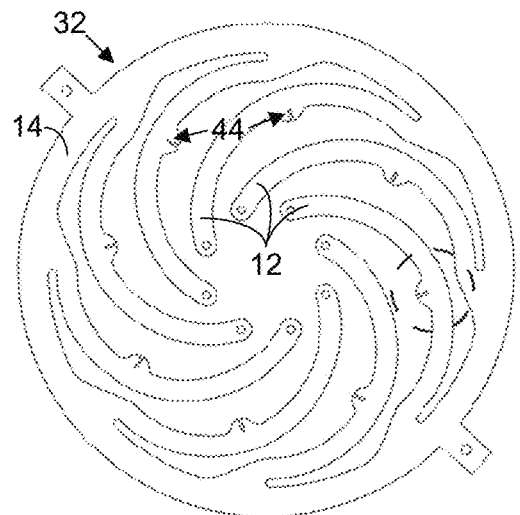
Figure 47:
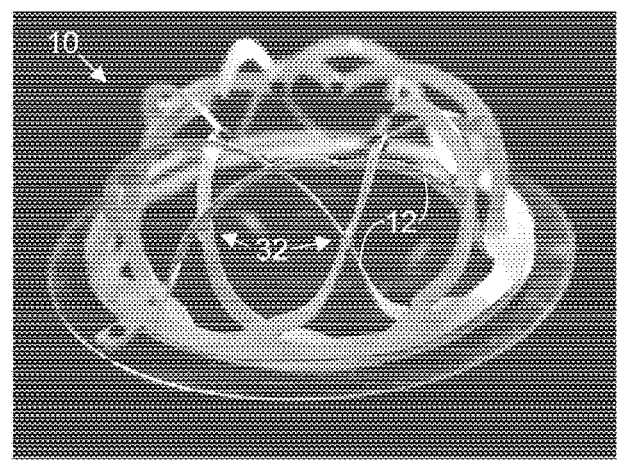
Figure 48:

As shown in FIGS. 43 and 44, the open center of previous embodiments can be crossed and tied together with short struts 42 to improve the stability of the KiriForm in its expanded state. The struts 42 can be separate members or can be incorporated within the geometry of the main cut of the Kiriform 10, as seen in the figures.

An embodiment of a Kiriform 10 with stability notches 44 added at various lengths along the fins 12 to freeze the Kiriform 10 in its expanded shape is shown in FIGS. 45-48. The location of the notch 44 will determine the amount of weight that the Kiriform 10 can support in its expanded state. In other embodiments, snap-fit joinery can be used to attach the fins 12 to each other.

Figure 49:
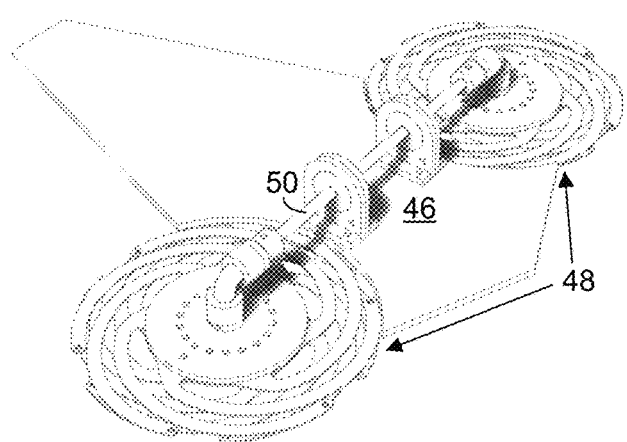
Figure 55:
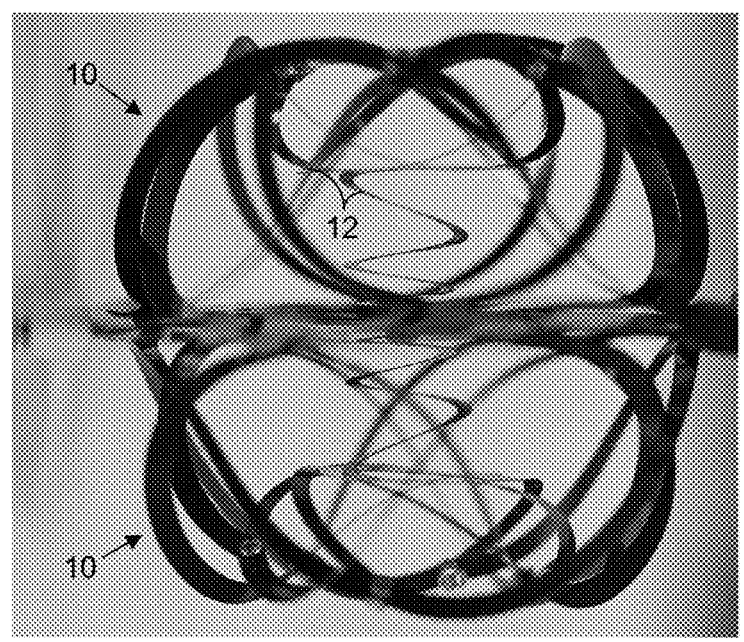
FIG. 55 illustrates a Kiriform 10 developed to serve as a spring with variable stiffness by simply rotating alternating sheet fins 12 to different degrees to produce coiling of the fins 12, as shown.

In one embodiment, Kiriforms can be employed as wheels 48 in a vehicle (e.g., a mobile robot), as shown in FIGS. 49-51, wherein the wheels 48 are cut from a multi-layer laminate structure 46 and pivoted and out of the plane of the laminate 46, extending out from an axle 50 to which they are rotatably coupled, with a remainder of the laminate 46 serving as the body of the vehicle. The wheels 48 in the embodiment of FIGS. 49 and 50 have a narrow configuration for high-speed travel on a hard surface (with a narrow contact area between the Kiriforms and the surface). The KiriForm wheel mechanism can be complemented with elastomeric and/or pneumatic inflatable wheels. Meanwhile, the wheels 48 in the embodiment of FIG. 51 are wide for traveling on, e.g., a dirt surface, wherein the wider wheels 48 provide additional traction and resistance in off-road conditions. By varying the degree of actuation of the Kiriform, the width of contact surface of the wheel can be adjusted. This configuration may be advantageous for smaller robotic platforms that may benefit from the ability to transform into near-flat, thin shapes to squeeze through narrow spaces and slots, as well as for full size vehicles with significant payload in terrestrial and space explorations. The robustness and simplicity of the mechanism can be advantageous over existing solutions. The extent of relative rotation between the two sheets will determine the extent of deployment and, hence, the effective width of the wheels 48.

Figure 56:
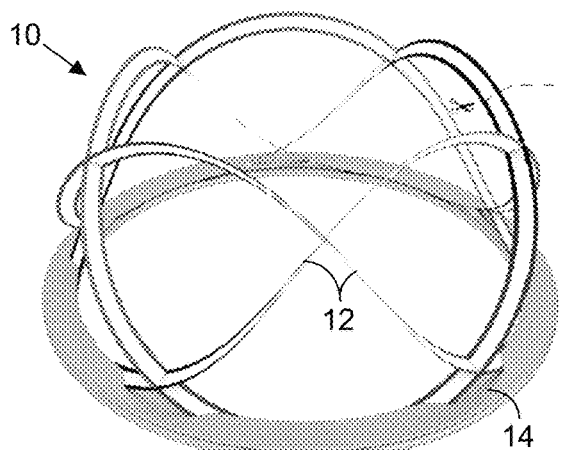
FIGS. 56 and 57 show embodiments of a Kiriform 10 in the form of a laminate of different elastic materials, including a polyethylene terephthalate (PET) sheet 56 and electroluminescent film 58, as shown in the sectional views.
Figure 57:
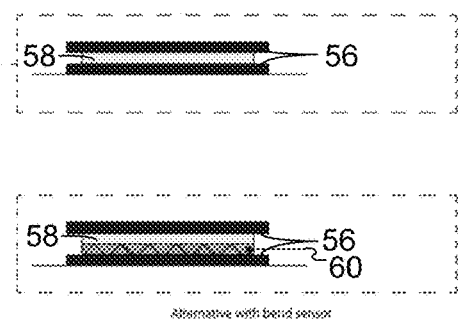

An additional embodiment of a KiriForm 10 formed from a laminate structure is shown in FIGS. 56 and 57. Materials suitable for a Kiriform include polymers and metals as well as other materials that have a pronounced elastic deformation phase and that can sustain large elastic strains. With these materials, the 3D form of the Kiriform can be fully reversible into the original 2D configuration. Hence, another embodiment of a Kiriform can be a laminate of different elastic materials, such as a PET sheet and an electroluminescent film. Such laminate can deploy and emit its own light. As shown in the sectional views, the laminate of the Kiriform shown in FIG. 56 includes an electroluminescent film 58 sandwiched between sheets 56 formed of polyethylene terephthalate (PET). FIG. 57 also includes a bend sensor 60 between the electroluminescent film 58 and one of the PET sheets 56. The bend sensor 60 can provide feedback to the extent of deployment of the Kiriform. Many other films can also be used, such as 3 m dichroic film, light redirection film, etc.

Figure 58:
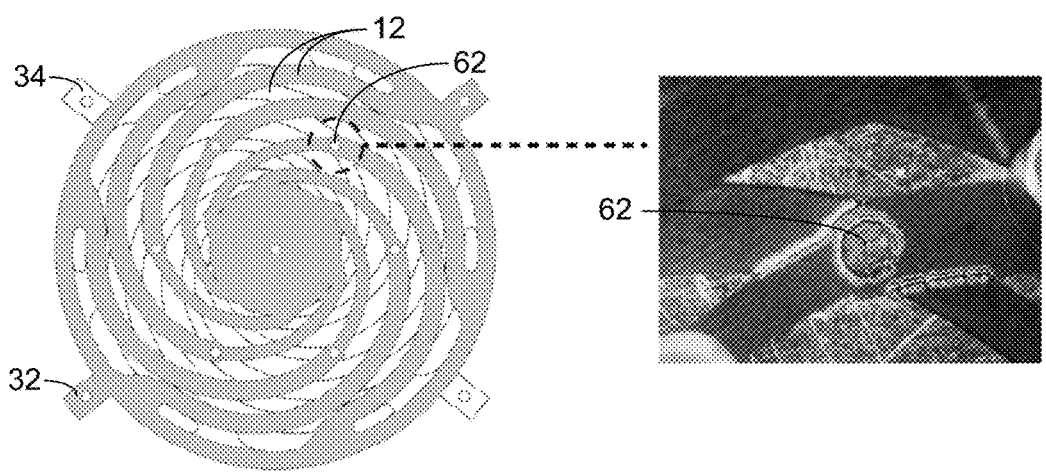
FIG. 58 shows a Kiriform 10, wherein the fins 12 of consecutive sheets 32 and 34 are welded together to form a rigid joint 62.
Figure 59:
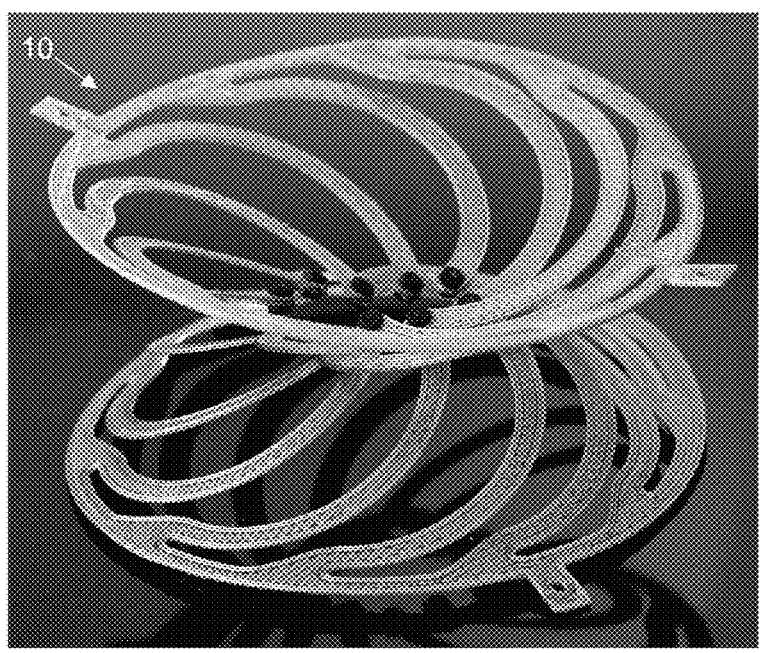
FIG. 59 shows a Kiriform 10 fabricated via 3D printing.
Figure 60:
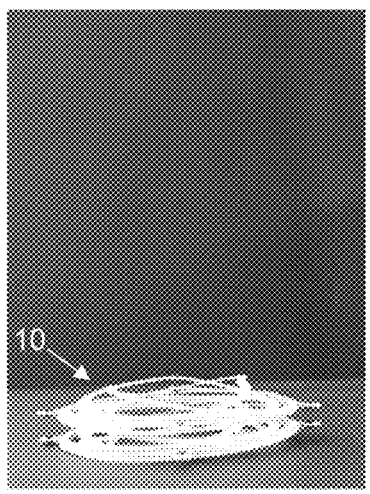
FIGS. 60-63 show the step-wise deployment of concentric ordered Kiriforms 10.
Figure 61:
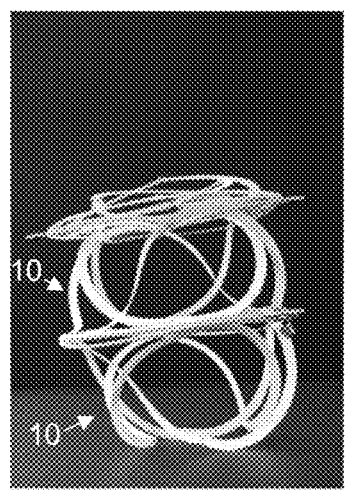
Figure 62:
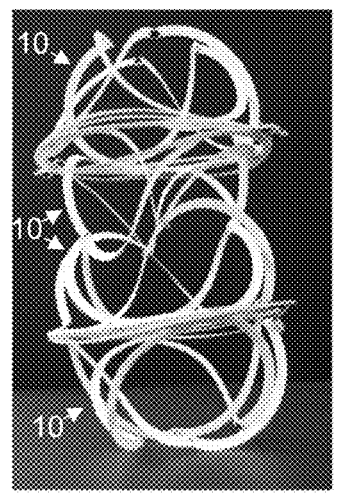
Figure 63:
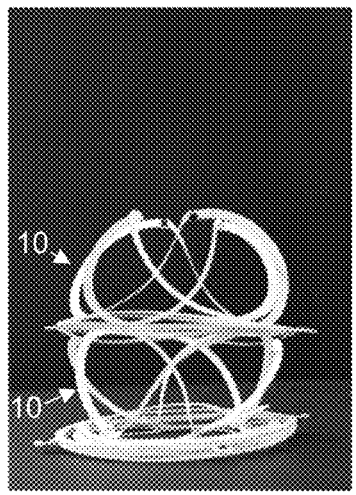
Figure 64:
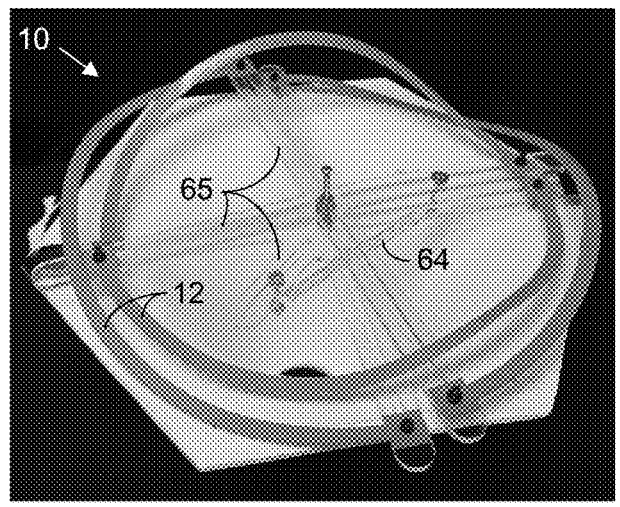
FIGS. 64-68 show a bi-stable embodiment of a Kiriform 10 that has two stable states due to the addition of a spring 64.
Figure 65:
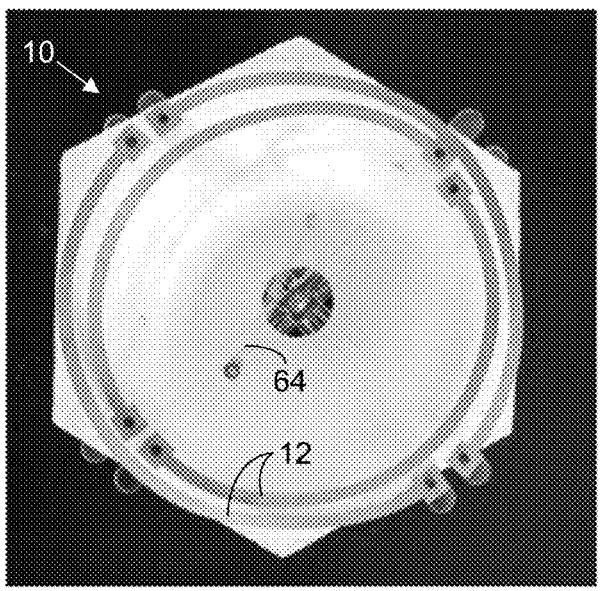
Figure 66:
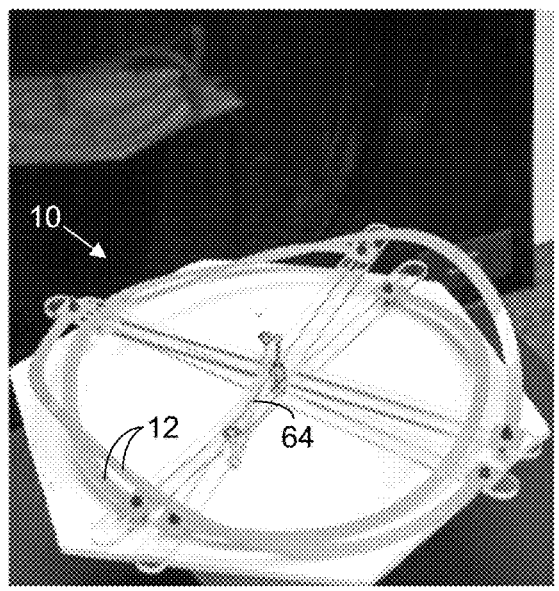
Figure 67:
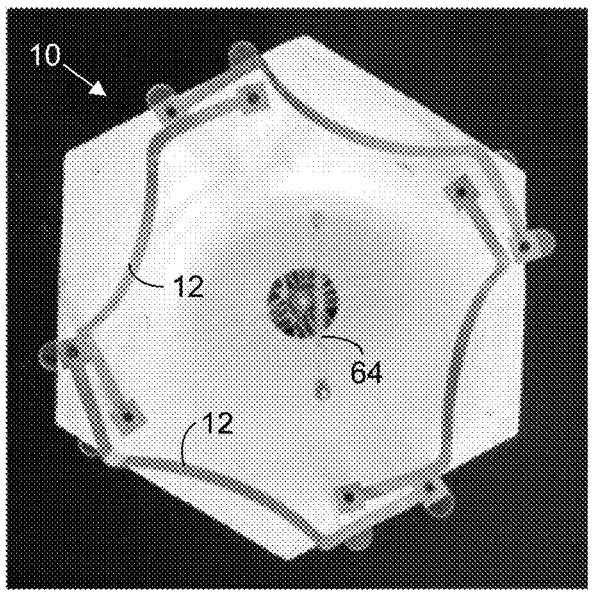
Figure 68:
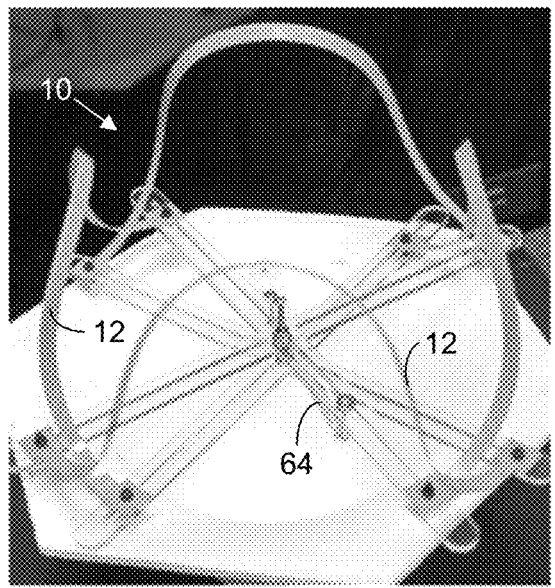

A Kiriform can also be used in a camera (or in the camera component of an electronic device, such as a smart phone), wherein a magnification or other lens can be mounted in the center of a section of the Kiriform, and wherein the Kiriform can be actuated to extend from a flat configuration to an extended configuration, wherein the lens can be displaced outwardly for magnification and/or focusing. A Kiriform 10 on a cell phone 52 is shown in FIGS. 52-54, wherein the Kiriform is mounted about the cell phone's camera. More broadly, a cell phone 52 can integrate the Kiriform 10 as an accessory in a variety of forms, such as a phone case or a camera lens adaptor (wherein the Kiriform 10 can include an additional lens or optical filter 54). In these embodiments, the ability to become completely flat may provide a compelling advantage over existing lends adaptors and converters that tend to be bulky when compared to the form factor of the phone. Additional variations in the methods for fabricating the Kiriforms can also be employed. For example, a Kiriform 10 in which the fins 12 of consecutive sheets 32 and 34 are welded together to form a rigid joint 62 is shown in FIG. 58. In another embodiment, shown in FIG. 59, a Kiriform 10 can be fabricated via 3D printing. One advantage offered via the use of 3D printing is the ability to more easily change the thickness and shape of the cross-section of the Kiriform 10, as compared to subtractive manufacturing.

Figure 69:
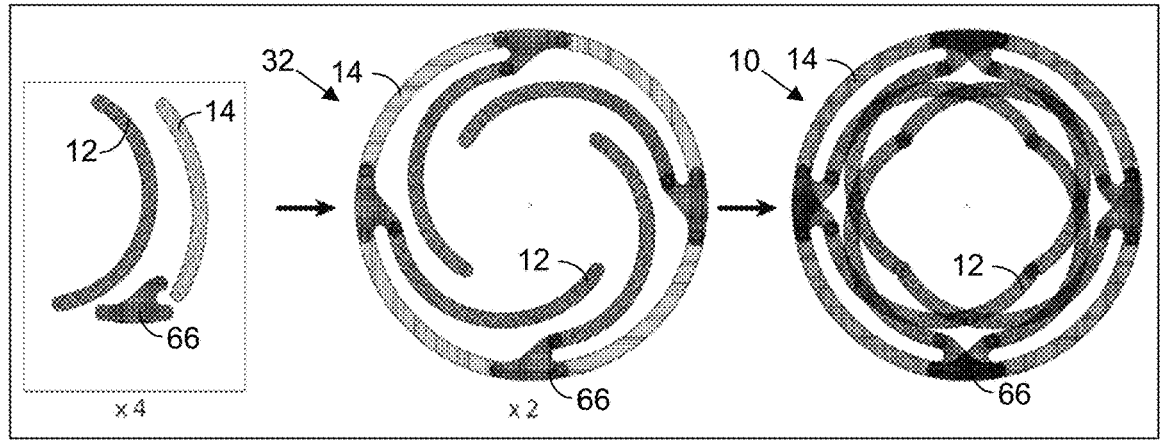
FIG. 69 shows a large-scale embodiment of a Kiriform 10 that is manufactured as separate parts, including discrete fins 12, a perimeter ring 14, and joining sections 66.

The Kiriform(s) 10 can also be arranged and configured in a variety of forms. For example, the structure shown in FIGS. 60-63 includes a plurality of stacked concentric-ordered Kiriforms 10 that are step-wise deployed. In another embodiment, shown in FIGS. 64-68, the Kiriform 10 includes two stable states as a consequence of including a spring 64. The spring 64 is attached, in tension, to rigid members 65 to which the ends of fins 12 are attached and which are rotatable about a central axis. The spring 64 reduces the amount of force required for the fins 12 of the Kiriform 10 to deploy. The large-scale embodiment of a Kiriform manufactured as separate parts (e.g., separate sections for the perimeter 14, fins 12, and joining sections 66) is shown in FIG. 69. The parts 12, 14, and 16 are connected with each other using hardware. This approach may be advantageous for large-scale applications, where cutting the Kiriform out of a single sheet may not be efficient for practical.

Figure 70:
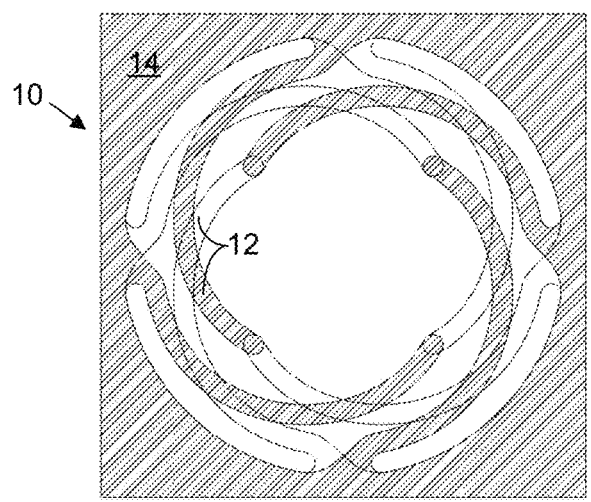
FIG. 70 shows a Kiriform 10 with a non-circular perimeter section 14.
Figure 71:
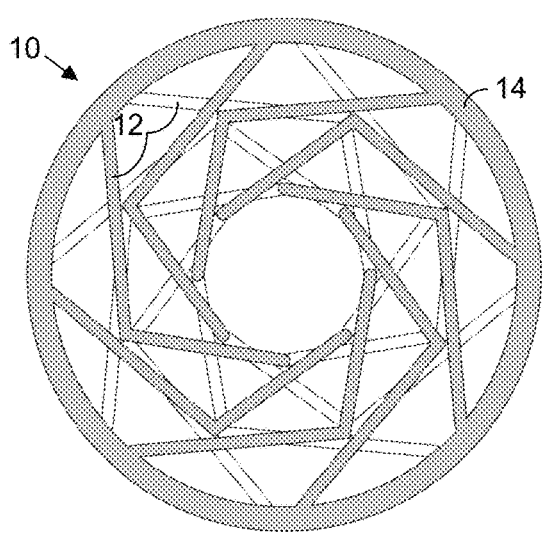
FIG. 71 shows a Kiriform 10 with fins 12 that are not curved.
Figure 72:
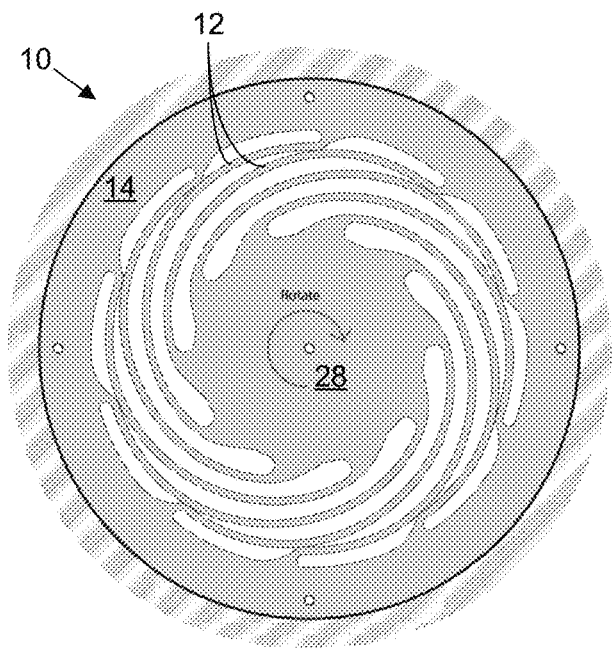
FIGS. 72 and 73 show an embodiment of a Kiriform 10 made of just a single sheet.
Figure 73:
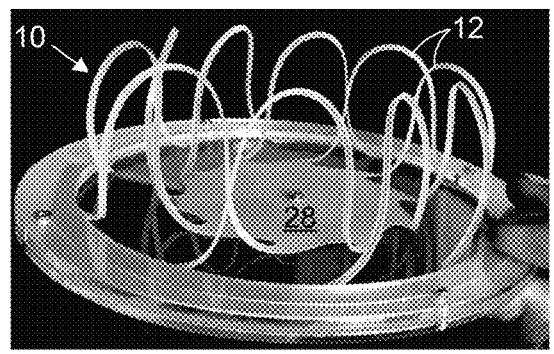
Figure 82:
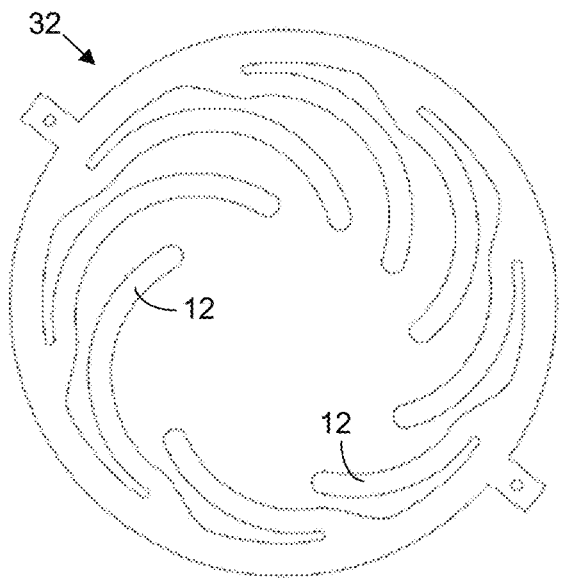
FIG. 82 shows a Kiriform 10 with different fins having different lengths within a Kiriform mechanism to create an eccentric hole; such a Kiriform would have a biased deployment.
Figure 83:
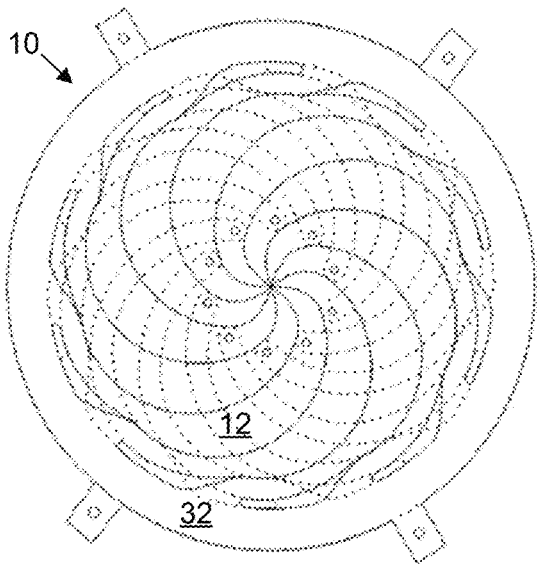
FIGS. 83-85 show an embodiment of Kiriform 10 that comprises two unsimilar cut sheets. The upper visible sheet 32 is fully closed such that, in its flat state, it is flushed without any voids but when actuated it becomes porous. The fins of the underlying sheet are illustrated with dashes in FIG. 83. The Kiriform 10 is shown in a collapsed (flat), unactuated state in FIGS. 83 and 84 and in an expanded, actuated state in FIG. 85.
Figure 84:
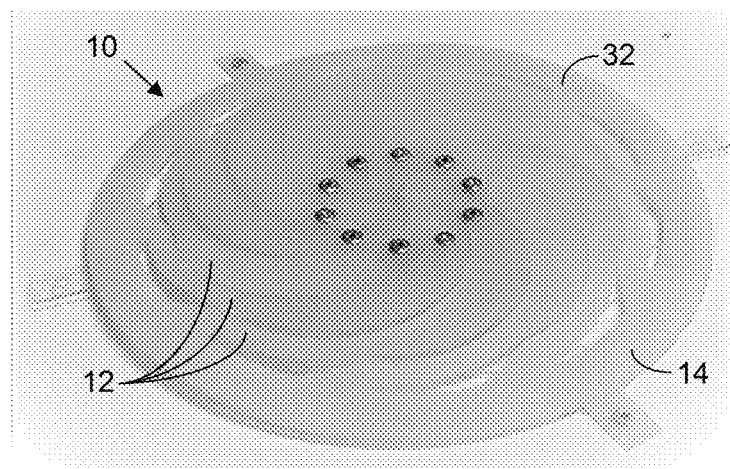
Figure 85:
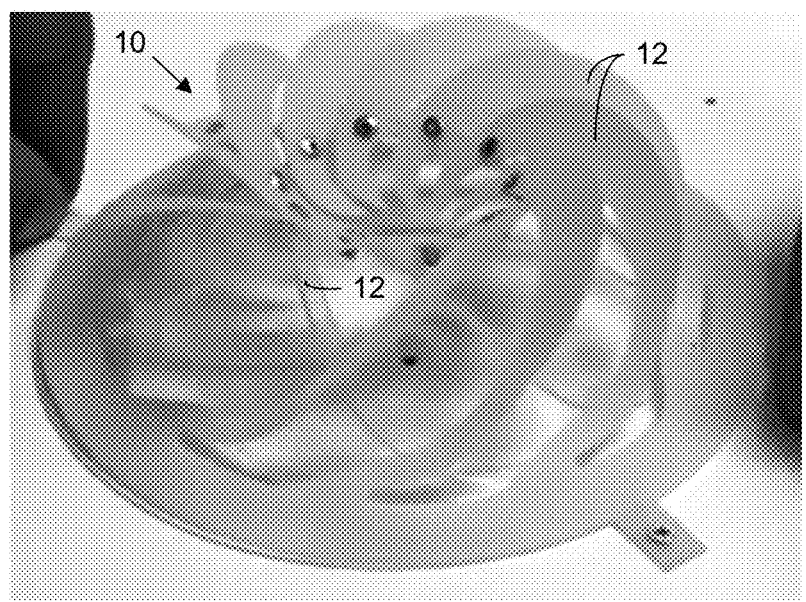
Figure 86:
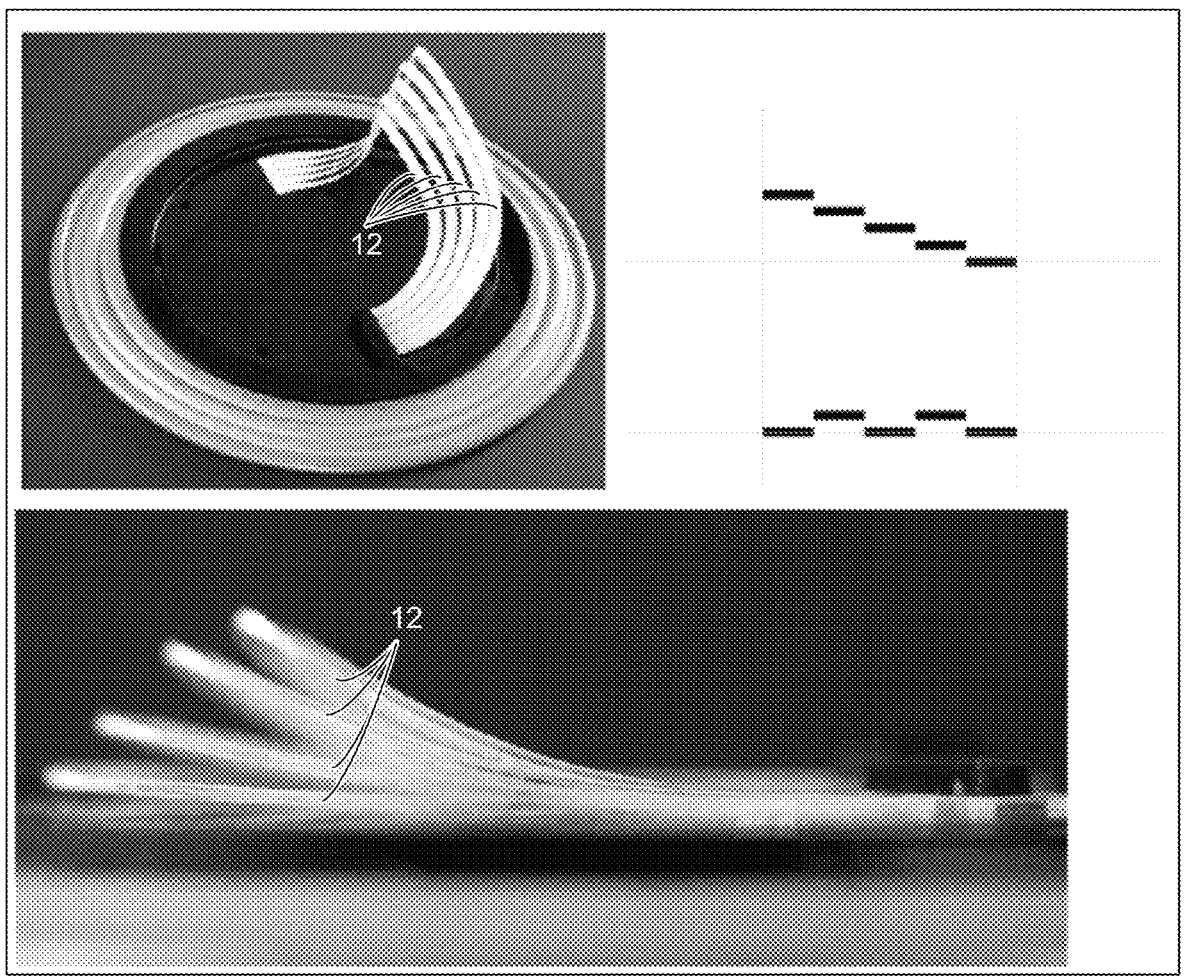
FIG. 86 shows a Kiriform 10 with a hierarchical fin deployment. By changing the aspect ratio of the fins 12 (thickness vs fin width), the deployment of the Kiriform 10 can be controlled so that there is a time delay between the deployment of each fin 12.

In other embodiments, perimeter 14 of the Kiriform 10 need not be circular. Rather, the perimeter 14 can be any shape as long as the force is rotational. For example, the Kiriform 10 of FIG. 70 is square in shape. Additionally, the fins 12 need not be curved, as shown by the polylines of the fins 12 shown in FIG. 71. Further still, the Kiriform 10 can be formed from just a single sheet, as shown in FIGS. 72 and 73. In this embodiment, with the outer perimeter 14 fixed rigidly, the fins 12 of the Kiriform 10 deploy when the inner part 28 is rotated clockwise about its central axis. In additional embodiments, fins 12 of different lengths, as shown in FIG. 82, are included in the Kiriform 10 to create an eccentric hole; this Kiriform 10 will have a biased deployment. In yet another embodiment, shown in FIGS. 83-85, a Kiriform 10 is made up of two un-similar cut sheets. The upper visible sheet 32 is fully closed such that in its flat state, it is flushed without any voids; but, when actuated, it becomes porous. Finally, embodiments of the Kiriform 10 can employ hierarchical fin deployment, as shown in FIG. 86; by changing the aspect ratio of the fins (thickness vs fin width), the deployment of the Kiriform can be controlled so that there is a time delay between the deployment of each fin.

Figure 75:
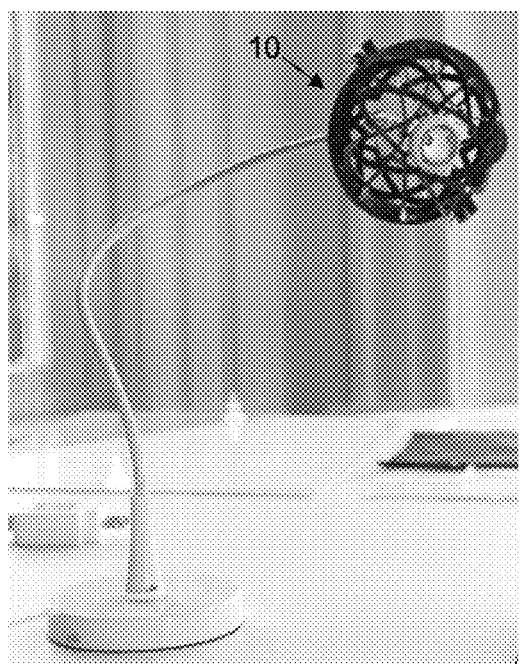
FIG. 75 shows an embodiment of a Kiriform 10 incorporated into a desk lamp.
Figure 76:
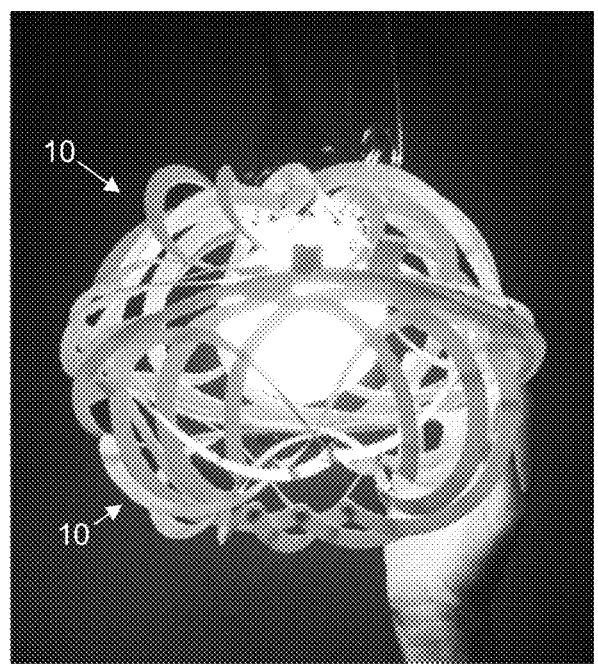
FIG. 76 shows an embodiment of a Kiriform 10 used as a lamp shade.
Figure 77:
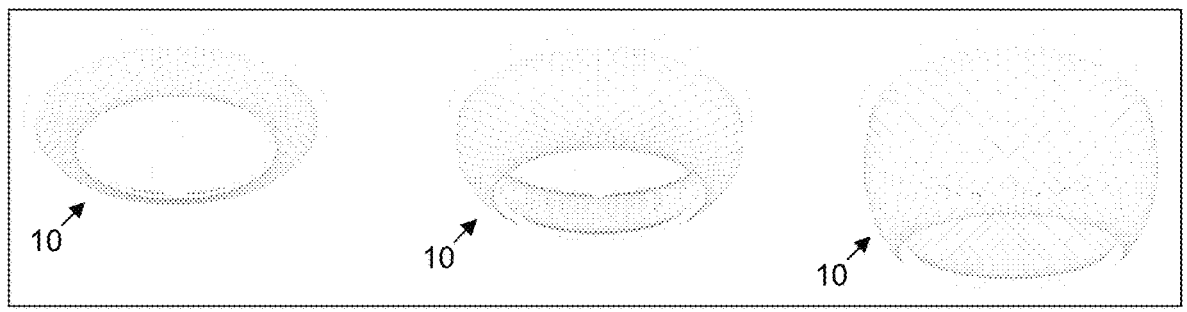
FIG. 77 shows an embodiment of a Kiriform 10 used as a flushed ceiling light or sconce.

Kiriforms 10 can also be incorporated into device that a provide a source of light, wherein the Kiriform may be retractable. For example, a Kiriform 10 is incorporated into a desk lamp in FIG. 75. The source of light can be separate from the Kiriform 10, or the geometry of the Kiriform laminate can include an embedded electroluminescent sheet that can serve as a source of light. A Kiriform 10 can also be used as a lamp shade mounted about a light bulb, as shown in FIG. 76. The Kiriform lamp shade can be used as a retrofit on existing fittings, or it can be a standalone ceiling-mounted light. In the embodiment of FIG. 77, the Kiriform 10 is mounted for use as a flushed ceiling light or sconce.

Figure 18:
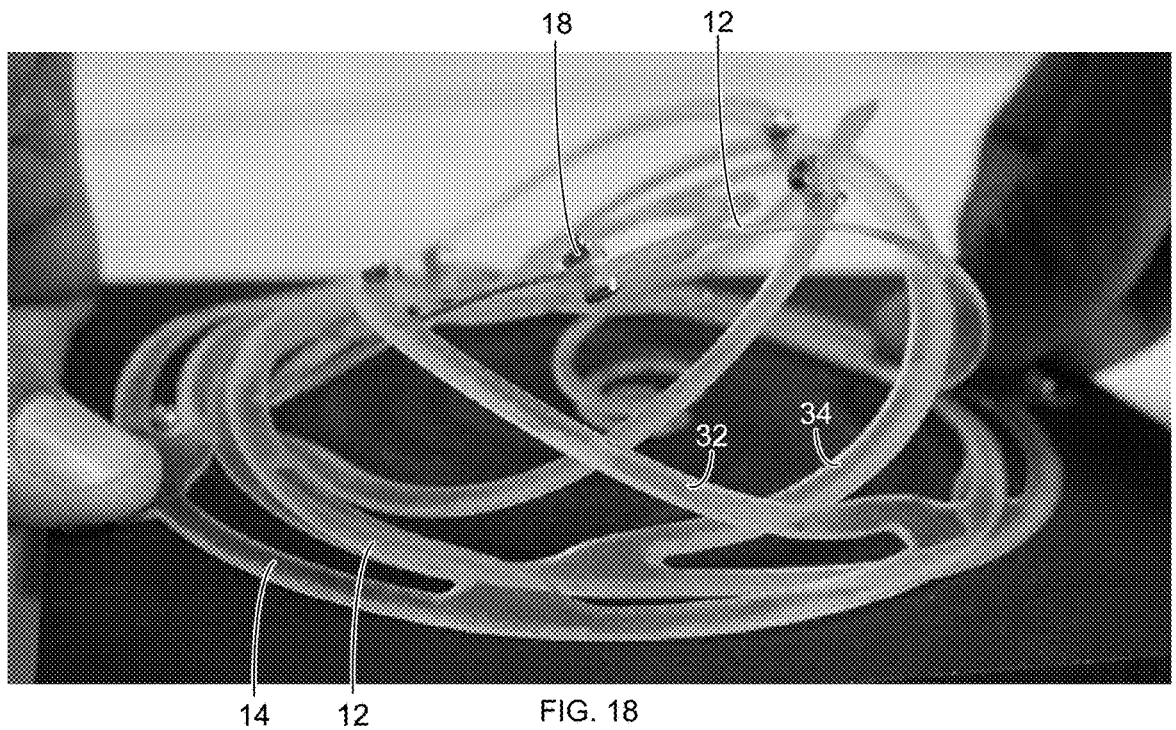
FIG. 18 shows that by displacing the top section 32 of the Kiriform with a certain distance from the bottom section 34 and performing an eccentric rotation creates a bias in the overall system and can be used to direct the linear displacement and tilt of some fins 12 with respect to the others within the same system. This mechanism can be used in medical devices such as endoscopes, stents to navigate or change camera angles.
Figure 19:
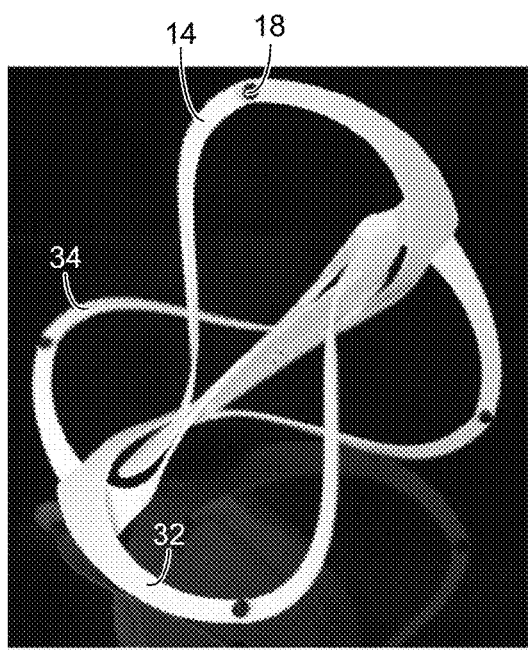
FIG. 19 shows an embodiment of a Kiriform, wherein the two sections 32 and 34 are joined internally along a central axis about which they can be counter-rotated with the buckling fins extending outward therefrom.
Figure 20:
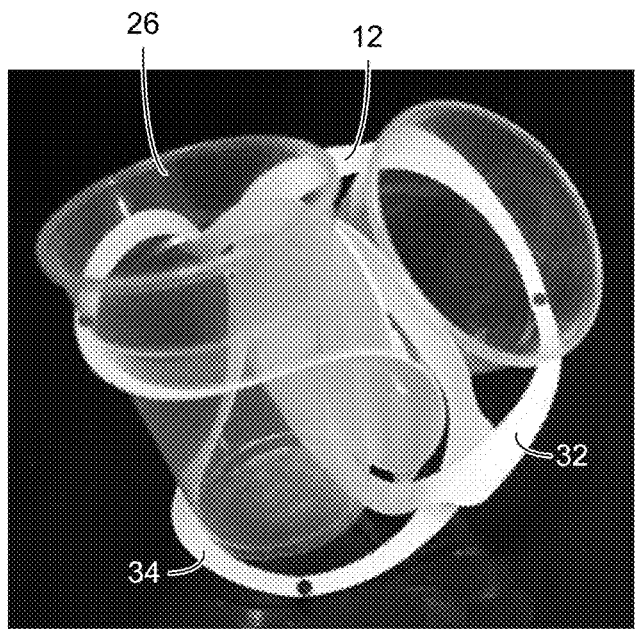
FIG. 20 shows an embodiment of a Kiriform that can be mounted to a surface and actuated via rotation to serve as a cup holder, while lying flat when not actuated.
Figure 21:
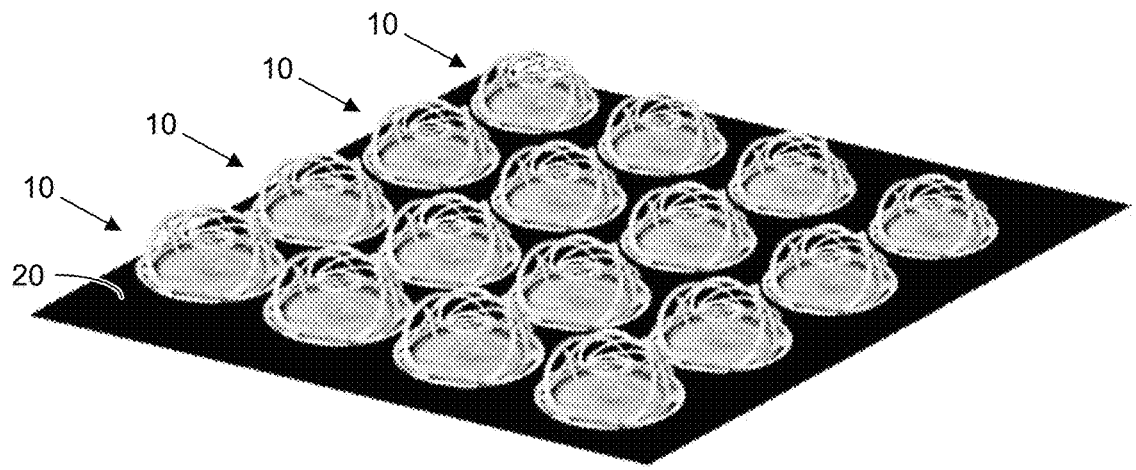
FIG. 21 shows a serial arrangement of Kiriforms 10 on a surface 20.
Figure 22:
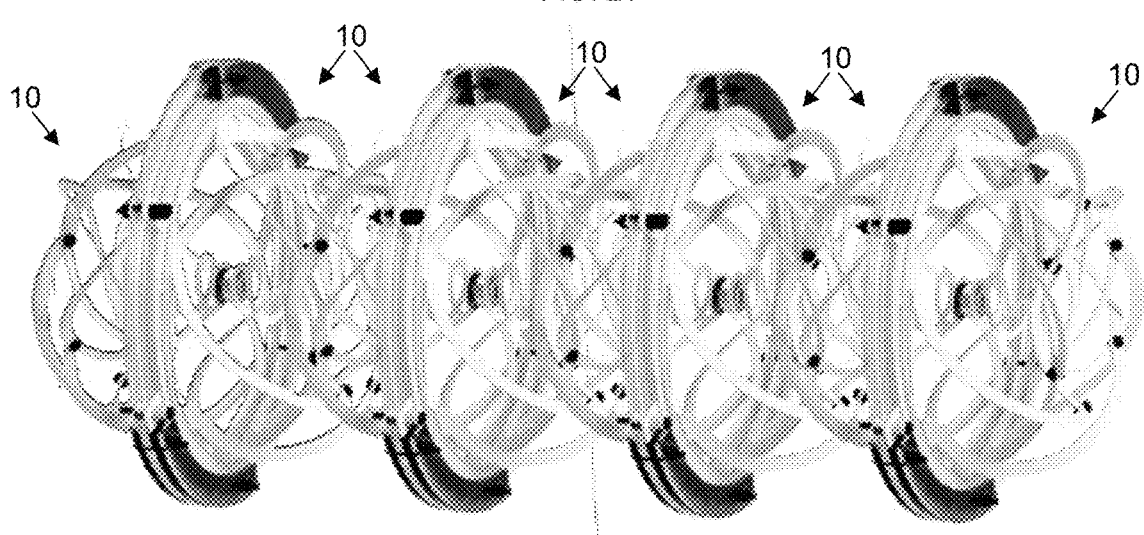
FIG. 22 shows stacking of four inter-connected Kiriform structures 10 arrayed in a concentric order with the fins of a top section of each inner Kiriform structure joined to a fin of an adjacent bottom section of another inner Kiriform structure and with an outer rigid frame attached like an exoskeleton.
Figure 23:
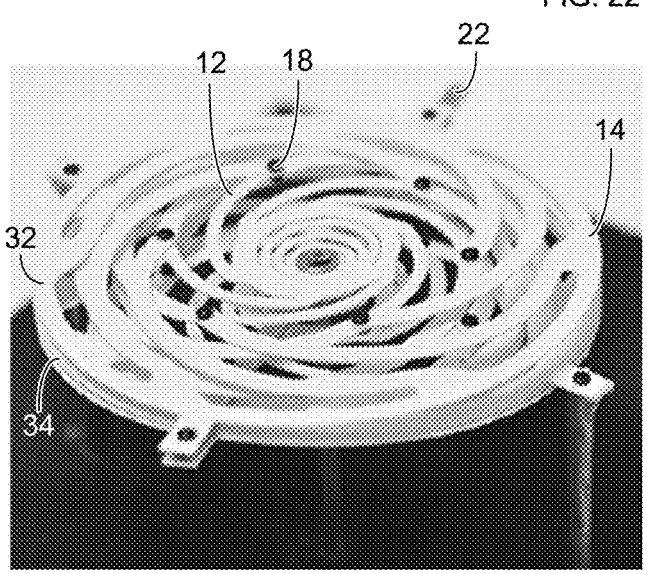
FIGS. 23-26 show sequential degrees of actuation of an embodiment of a Kiriform via rotation (with tangential force applied by the operator's finger) of the top section 32 of the Kiriform.
Figure 24:
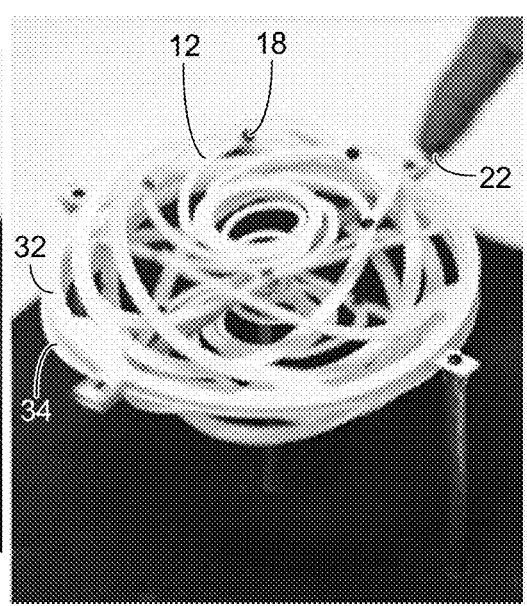
Figure 25:
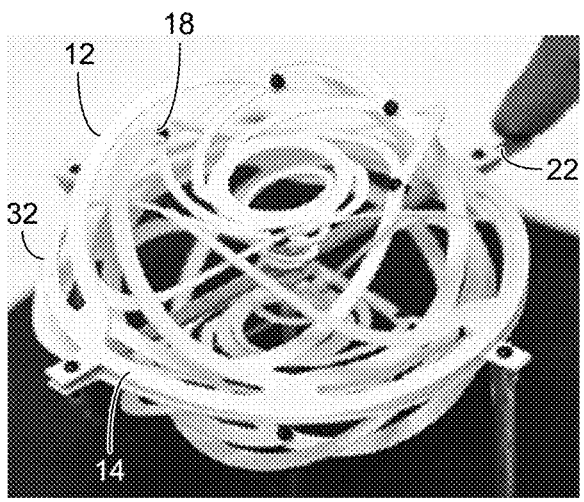
Figure 26:
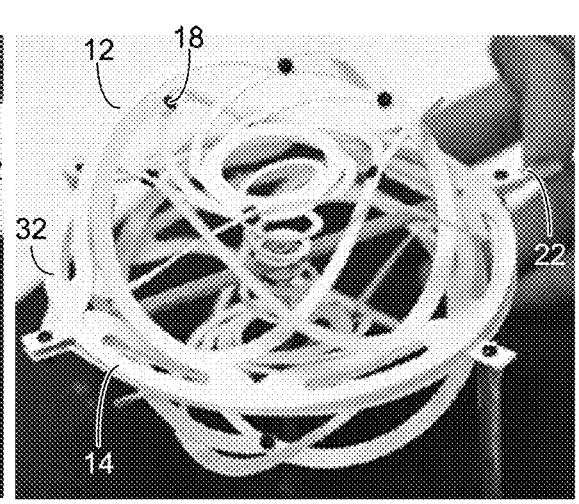
Figure 29:
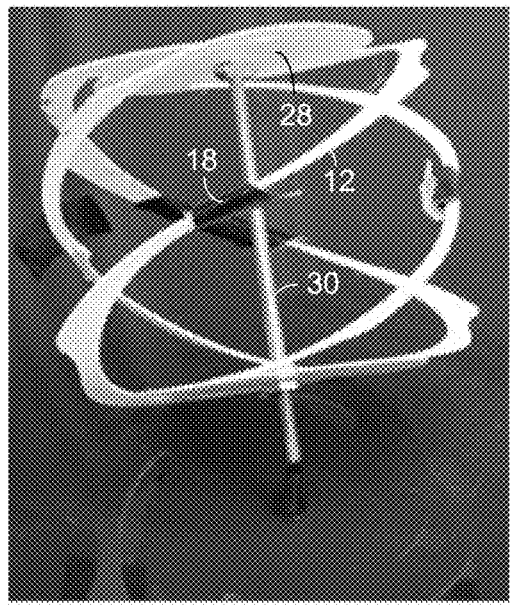
FIGS. 29 and 30 show embodiments of Kiriform structures for use as wind rotors.
Figure 30:
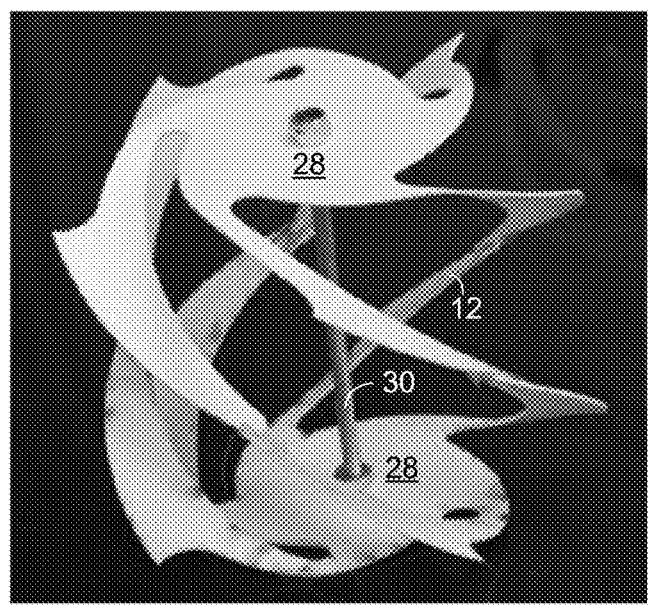
Figure 78:
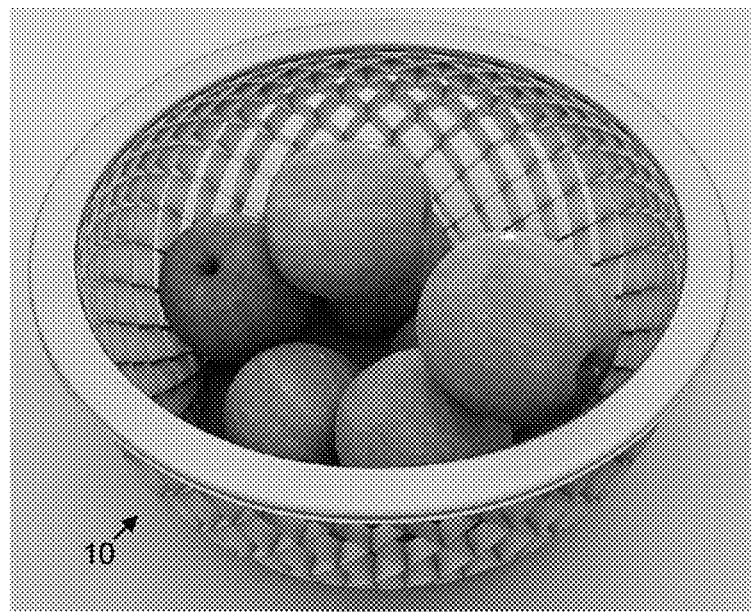
FIG. 78 shows an embodiment of a Kiriform 10 used as a colander.
Figure 79:
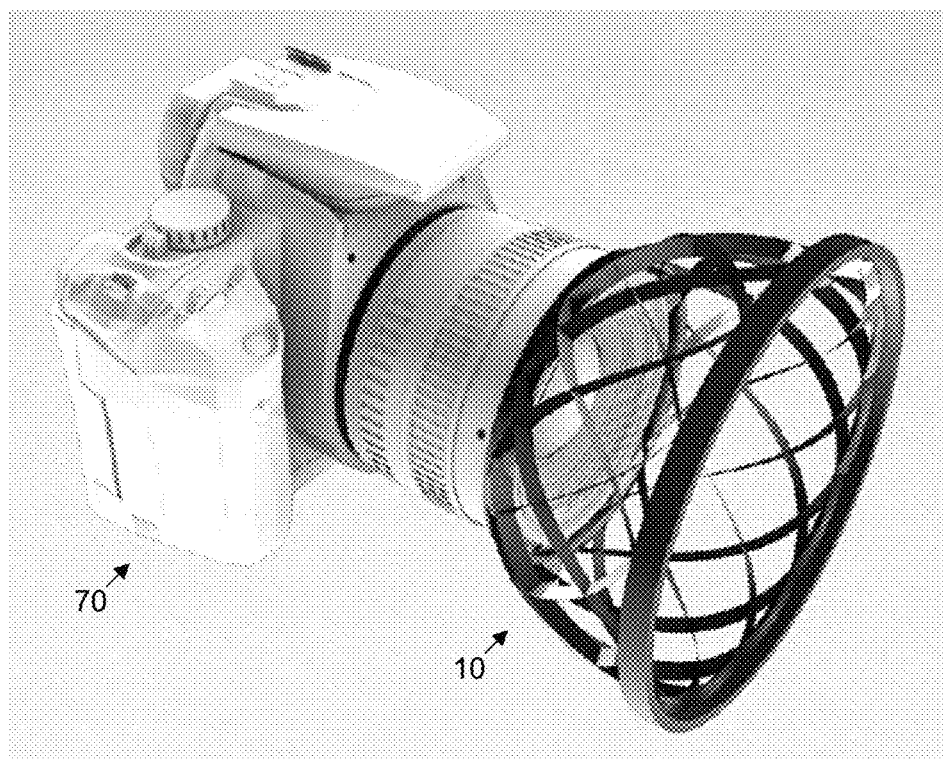
FIG. 79 shows an embodiment of Kiriform 10 mounted to a camera 70 to operate as a camera lens or a lens hood that can fold flat.
Figure 80:
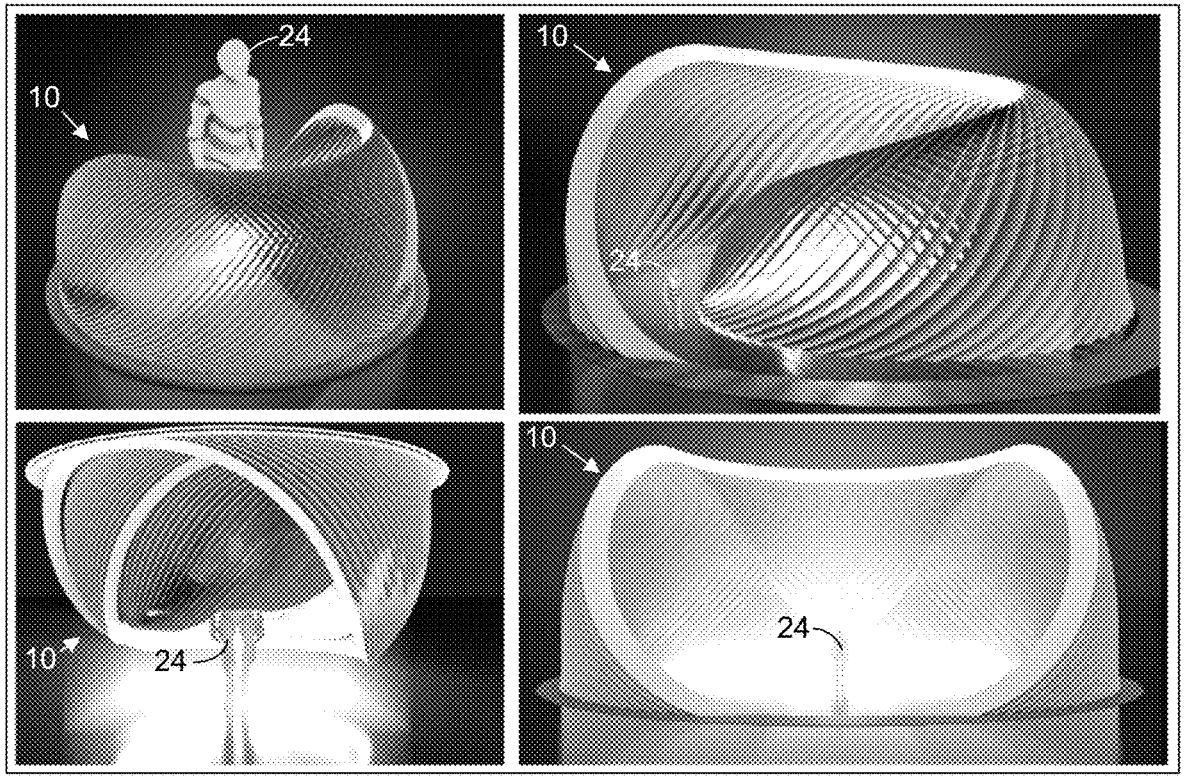
FIG. 80 shows large-scale embodiments of a Kiriform 10 as architectural envelopes at multiple scales, from a counter to a privacy booth to a pavilion with a human 24 scale for reference.
Figure 81:
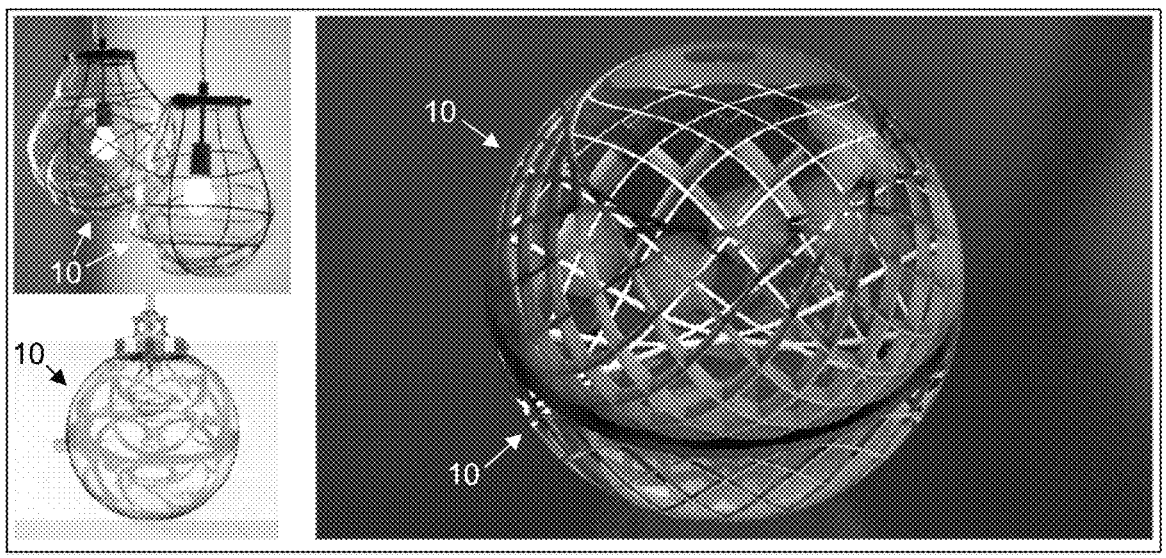
FIG. 81 shows an embodiment of a Kiriform 10 as an exoskeleton for glass blowing to manufacture novel light fixtures.

Additional potential applications include the following:

- pop-up mechanisms (flat/2d to form/3D), such as for a pop-up cup holder, as shown in FIGS. 19 and 20, which can pop-up from a table surface to hold cups 26;
- surface-texture modulation, as shown in FIG. 21;
- serving as a mechanism to create an opening between surfaces, wherein a plurality of the Kiriform can be coupled in series, as shown in FIG. 22, to provide an increased gap from end-to-end upon serial actuation;
- use as a filter to allow particles of a certain size through;
- scaling up for deployable shelters, tents and disaster relief structures, as shown in FIG. 17;
- scaling down for micro-surgical tools and medical devices, such as stents and MEMS, as shown in FIG. 18 non-tangential force can be applied to steer the fins in desired angles, which can be useful in other applications, as well;
- provision of facade design and/or regulation of light;
- adjustable regulation of flow of liquid or air through the Kiriform depending on level of actuation;
- combination with other materials, wherein the Kiriform acts as a substrate from which material enclosure can stretch;
- the Kiriform can include or utilize a light source to operate as a pop-up lantern, wherein the Kiriform can include a substrate that increases surface tension and, when deployed, allows the transmission of light;
- use as a wind rotor (advantageously, where the fins are shaped/twisted/rotated for aerodynamic purposes), as shown in the configurations of FIGS. 29 and 30, which resemble the structure of a Flettner rotor for a windmill; use of a Kiriform in this context is advantageous because its structure can be collapsed during a wind storm to prevent damage to the structure by high wind forces;
- use as a tunable spring, wherein the degree of actuation of the Kiriform determines the spring constant (force/deflection) or compliance (deflection/force) of the spring, wherein the spring can be provided with variable stiffness by simply rotating alternating sheet fins 12 to different degrees to produce coiling of the fins 12, as shown in FIG. 54;
- use as space deployable, wherein the Kiriform can be launched and delivered into space in a collapsed form aboard a spacecraft and then expanded (deployed) after being released into space from the spacecraft; and
- use of opposing Kiriforms as a robotic gripper;
- use as a collapsible collander, as shown in FIG. 78;
- use as a camera lens or a lens hood that can fold flat when mounted to a camera 70, as shown in FIG. 79; light can be prevented from entering through the sides of the Kiriform 10 by attaching a stretchable fabric, such as lycra or nylon, to the Kiriform 10);
- use as a large-scale architectural envelope at multiple scales, as shown in FIG. 80, from a counter (upper left), a privacy booth (upper right and lower left), to a pavilion (lower right) with a human scale for reference;
- use as an exoskeleton for glass blowing to manufacture novel light fixtures, as shown in FIG. 81.

In describing embodiments of the invention, specific terminology is used for the sake of clarity. For the purpose of description, specific terms are intended to at least include technical and functional equivalents that operate in a similar manner to accomplish a similar result. Additionally, in some instances where a particular embodiment of the invention includes a plurality of system elements or method steps, those elements or steps may be replaced with a single element or step. Likewise, a single element or step may be replaced with a plurality of elements or steps that serve the same purpose. Further, where parameters for various properties or other values are specified herein for embodiments of the invention, those parameters or values can be adjusted up or down by $1/100^{th}$, $1/50^{th}$, $1/20^{th}$, $1/10^{th}$, $1/5^{th}$, $1/3^{rd}$, $1/2$, $2/3^{rd}$, $3/4^{th}$, $4/5^{th}$, $9/10^{th}$, $19/20^{th}$, $49/50^{th}$, $99/100^{th}$, etc. (or up by a factor of 1, 2, 3, 4, 5, 6, 8, 10, 20, 50, 100, etc.), or by rounded-off approximations thereof, unless otherwise specified. Moreover, while this invention has been shown and described with references to particular embodiments thereof, those skilled in the art will understand that various substitutions and alterations in form and details may be made therein without departing from the scope of the invention. Further still, other aspects, functions, and advantages are also within the scope of the invention; and all embodiments of the invention need not necessarily achieve all of the advantages or possess all of the characteristics described above. Additionally, steps, elements and features discussed herein in connection with one embodiment can likewise be used in conjunction with other embodiments. The contents of references, including reference texts, journal articles, patents, patent applications, etc., cited throughout the text are hereby incorporated by reference in their entirety for all purposes; and all appropriate combinations of embodiments, features, characterizations, and methods from these references and the present disclosure may be included in embodiments of this invention. Still further, the components and steps identified in the Background section are integral to this disclosure and can be used in conjunction with or substituted for components and steps described elsewhere in the disclosure within the scope of the invention. In method claims (or where methods are elsewhere recited), where stages are recited in a particular order—with or without sequenced prefacing characters added for ease of reference—the stages are not to be interpreted as being temporally limited to the order in which they are recited unless otherwise specified or implied by the terms and phrasing.

What is claimed is:

1. A deployable Kiriform flexure, comprising:
   - a first section of the Kiriform flexure comprising a plurality of fins extending from at least one of a first perimeter ring and a first inner hub and arranged about a central axis; and
   - a second section of the Kiriform flexure comprising a plurality of fins extending from at least one of a second perimeter ring and a second inner hub and arranged about a central axis, wherein each fin of the second section is joined with a fin of the first section such that the first and second sections share a common central axis in a configuration that produces out-of-plane elastic buckling of the fins to actuate the Kiriform flexure from a substantially flat structure that extends substantially only in two dimensions orthogonal to the central axis to an expanded structure extending substantially in a third dimension parallel to the central axis when at least one of the first and second perimeter rings or inner hubs is rotated relative to the other perimeter ring or inner hub.

2. The deployable Kiriform flexure of claim 1, wherein the fins extend from the first and second perimeter rings, the Kiriform flexure further comprising an actuation structure at a periphery of at least one of the first and second perimeter rings, wherein the actuation structure is configured to generate the relative rotation of the at least one of the first and second perimeter rings, and wherein the fins extend inward from the perimeter rings.

3. The deployable Kiriform flexure of claim 1, wherein the fins extend from the first and second inner hubs, the Kiriform flexure further comprising a rotatable actuation structure configured to generate the relative rotation of at least one of the first and second inner hubs and extending along a central axis about which the first and second sections are arranged, wherein the fins extend outward from the central axis.

4. The deployable Kiriform flexure of claim 1, wherein the fins are joined with a bonding mechanism.

5. The deployable Kiriform flexure of claim 1, wherein the fins are seamlessly and integrally joined in a unified structure.

6. The deployable Kiriform flexure of claim 1, wherein the fins are curved.

7. The deployable Kiriform flexure of claim 1, wherein at least one of the fins is coiled to serve as a spring.

8. The deployable Kiriform flexure of claim 1, wherein the Kiriform flexure has a laminate structure.

9. The deployable Kiriform flexure of claim 8, wherein the Kiriform flexure is fabricated from a single sheet.

10. The deployable Kiriform flexure of claim 1, wherein the fins have different lengths to generate a biased deployment.

11. The deployable Kiriform flexure of claim 1, wherein the fins have different aspect ratios of thickness to width to produce a hierarchical sequenced deployment when actuated via increasing force.

12. The deployable Kiriform flexure of claim 1, wherein the Kiriform flexure is coupled with or incorporated into at least one of the following: a medical device, a vehicle and configured to operate as a wheel, a phone, a human enclosure, a light source, a camera, a blown-glass exoskeleton, a pop-up holder, a filter, a pop-up lantern, a wind rotor, a tunable spring, a space tool, a robotic gripper, and a collapsible colander.

13. A method for three-dimensional actuation using the deployable Kiriform flexure of claim 1, the method comprising:
  rotating at least one of the first and second sections relative to the other section; and
  producing an out-of-plane elastic buckling of the fins via that rotation to actuate the Kiriform flexure from a substantially flat structure that extends substantially only in two dimensions orthogonal to the central axis to an expanded structure extending substantially in a third dimension parallel to the central axis.

14. The method of claim 13, wherein the second section is fixedly mounted to a fixed structure, and wherein the first section is rotated about the central axis.

15. The method of claim 13, wherein the first section is rotated via a rotational force along the central axis.

16. The method of claim 13, wherein the first section is rotated via a rotational force along a perimeter of the first section.

17. The method of claim 13, wherein the Kiriform flexure is repeatedly actuated from its flat to extended configuration and back without plastic deformation.

18. The method of claim 13, further comprising actuating the Kiriform flexure to perform at least one of the following functions: providing shelter for humans, displacing a lens for focusing or magnification, operation as a Flettner windmill rotor, operation as a tunable spring to provide variable compliance or force, operation as a filter to filter a fluid, actuation in space, operation as a wheel of a vehicle, providing an exoskeleton for blown glass, holding or containing an object, manipulating an object, and providing or manipulating light.

19. The method of claim 13, further comprising inserting the Kiriform flexure into a human and operating the Kiriform structure as a medical device.

20. The method of claim 13, further comprising applying a non-tangential force to the first or second section to steer the fins in required angles.

* * * * *